United States Patent
Hass et al.

(10) Patent No.: US 8,110,043 B2
(45) Date of Patent: Feb. 7, 2012

(54) APPARATUS AND METHOD FOR APPLYING COATINGS ONTO THE INTERIOR SURFACES OF COMPONENTS AND RELATED STRUCTURES PRODUCED THEREFROM

(75) Inventors: Derek D. Hass, Charlottesville, VA (US); Haydn N. G. Wadley, Keswick, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 1462 days.

(21) Appl. No.: 10/584,682

(22) PCT Filed: Jan. 10, 2005

(86) PCT No.: PCT/US2005/000606
§ 371 (c)(1),
(2), (4) Date: Jun. 28, 2006

(87) PCT Pub. No.: WO2005/089107
PCT Pub. Date: Sep. 29, 2005

(65) Prior Publication Data
US 2009/0017217 A1    Jan. 15, 2009

Related U.S. Application Data

(60) Provisional application No. 60/535,442, filed on Jan. 8, 2004, provisional application No. 60/637,522, filed on Dec. 20, 2004.

(51) Int. Cl.
*B05B 13/00* (2006.01)
*B05D 7/22* (2006.01)

(52) U.S. Cl. ........ 118/715; 118/720; 118/721; 118/317; 427/585; 427/595; 427/596; 427/597; 427/598; 427/237; 427/238; 427/248.1; 427/250; 427/255.28; 427/255.395; 427/255.6; 427/282; 438/478

(58) Field of Classification Search ................ 427/237, 427/238, 248.1, 585, 595, 596, 597, 598, 427/250, 255.28, 255.395, 255.6, 282; 118/317, 118/715, 720, 721; 438/478
See application file for complete search history.

(56) References Cited

U.S. PATENT DOCUMENTS
4,407,712 A * 10/1983 Henshaw et al. ........ 204/298.05

FOREIGN PATENT DOCUMENTS
WO    WO 01/90438 A1 * 11/2001
* cited by examiner

*Primary Examiner* — William Phillip Fletcher, III
(74) *Attorney, Agent, or Firm* — Novak Druce DeLuca + Quigg LLP; Robert J. Decker

(57) ABSTRACT

A methodology and system for applying coatings onto the interior surfaces of components, includes a vapor creation device, a vacuum chamber having a moderate gas pressure and an inert gas jet having controlled velocity and flow fields. The gas jet is created by a rarefied, inert gas supersonic expansion through a nozzle. By controlling the carrier gas flow into a region upstream of the nozzle an upstream pressure is achieved. The carrier gas flow and chamber pumping rate control the downstream pressure. The ratio of the upstream to downstream pressure along with the size and shape of the nozzle opening controls the speed of the gas entering the chamber. Vapor created from a source is transported into the interior regions of a component using binary collisions between the vapor and gas jet atoms. These collisions enable the vapor atoms to scatter onto the interior surfaces of the component and deposit.

109 Claims, 22 Drawing Sheets

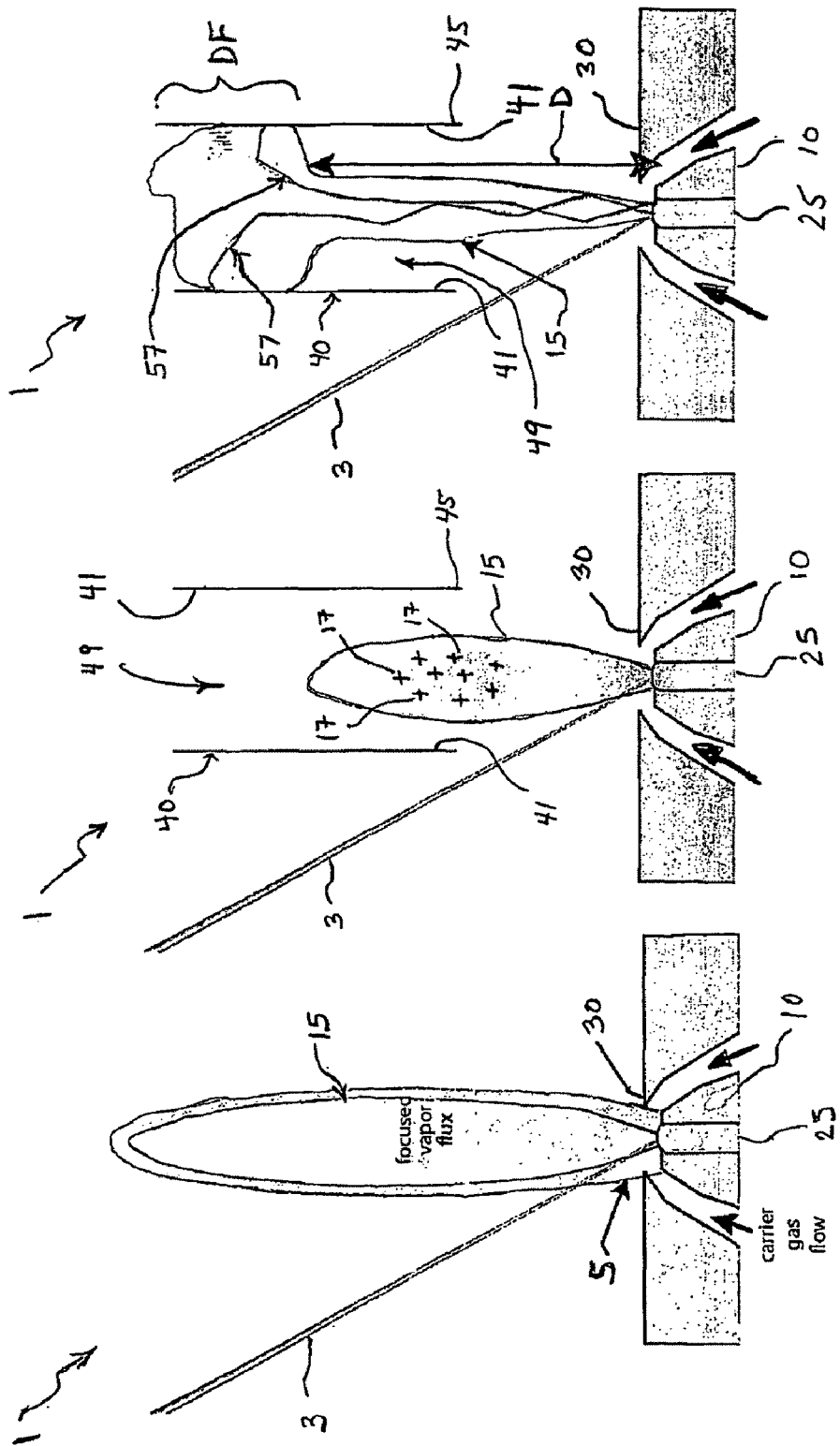

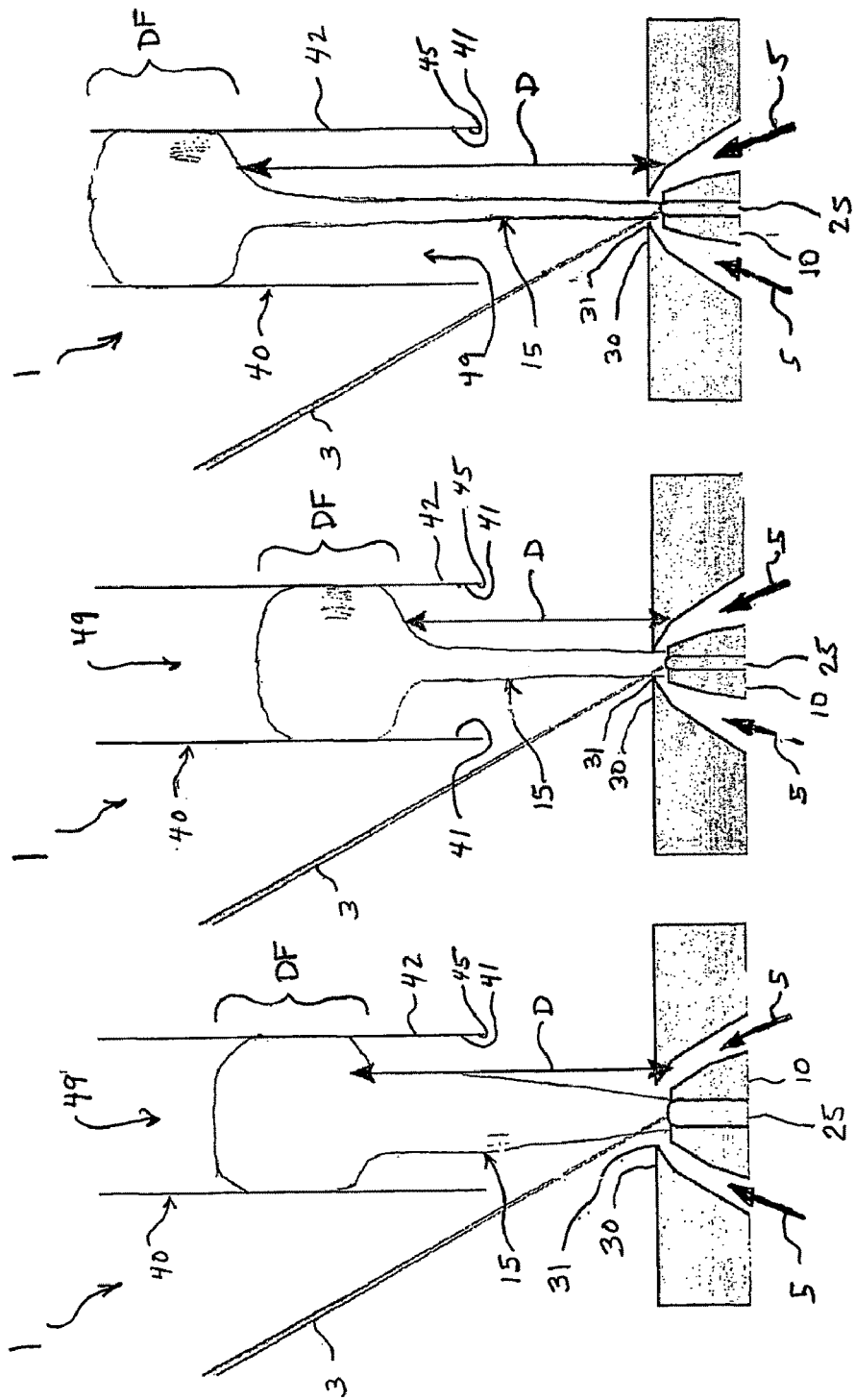

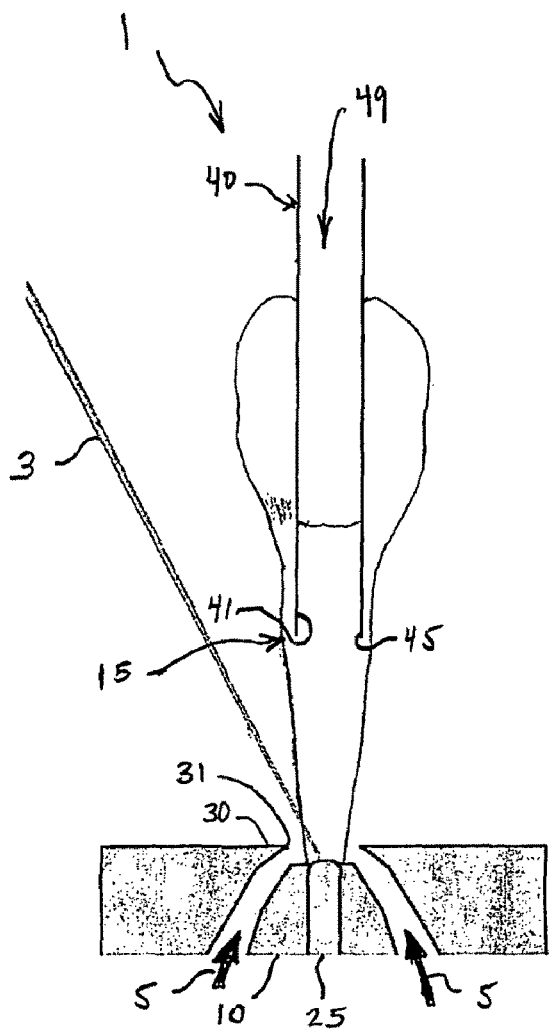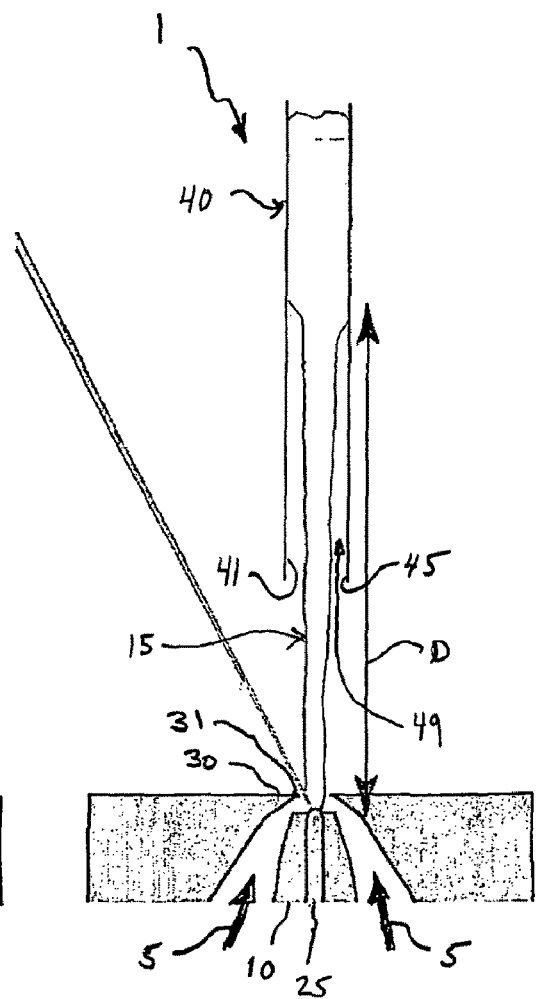
FIG. 7A
FIG. 7B

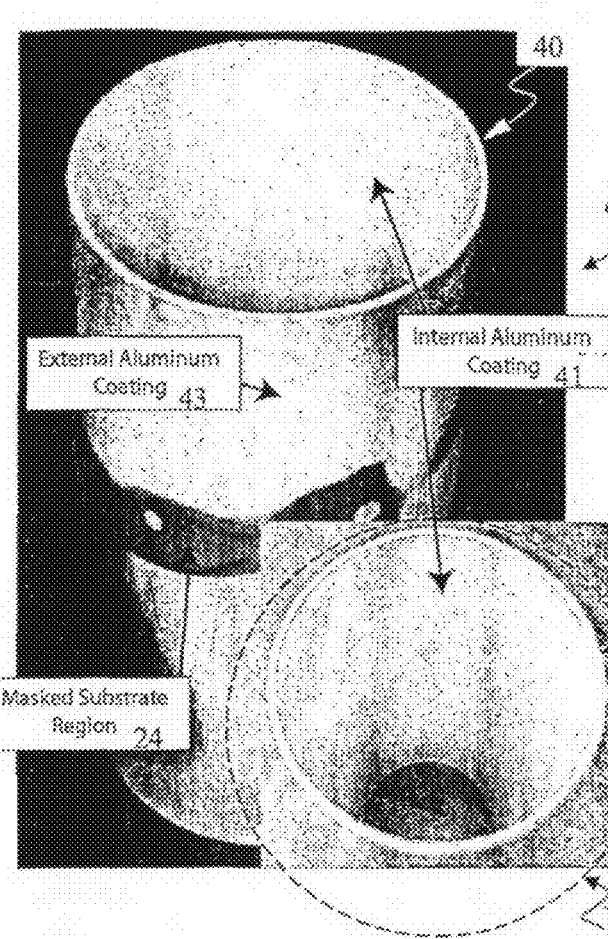
FIG. 9A
FIG. 9B
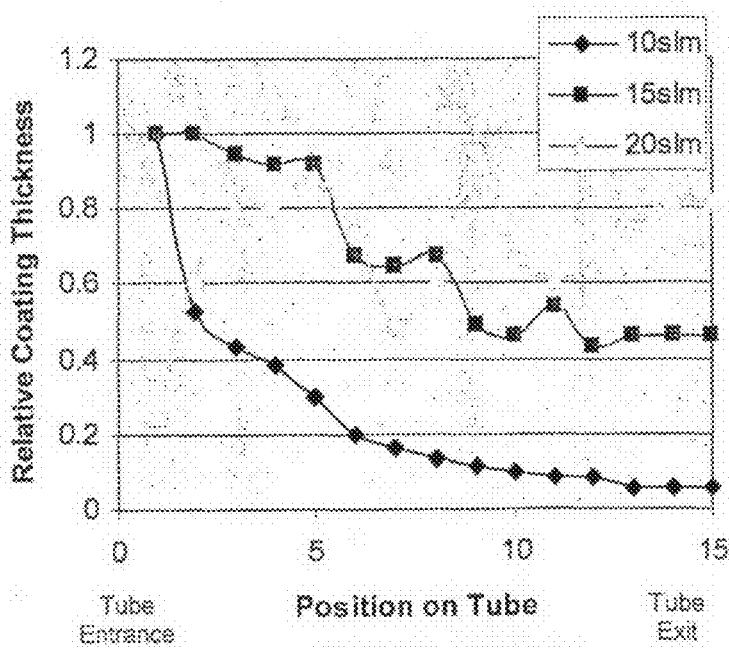
FIG. 10

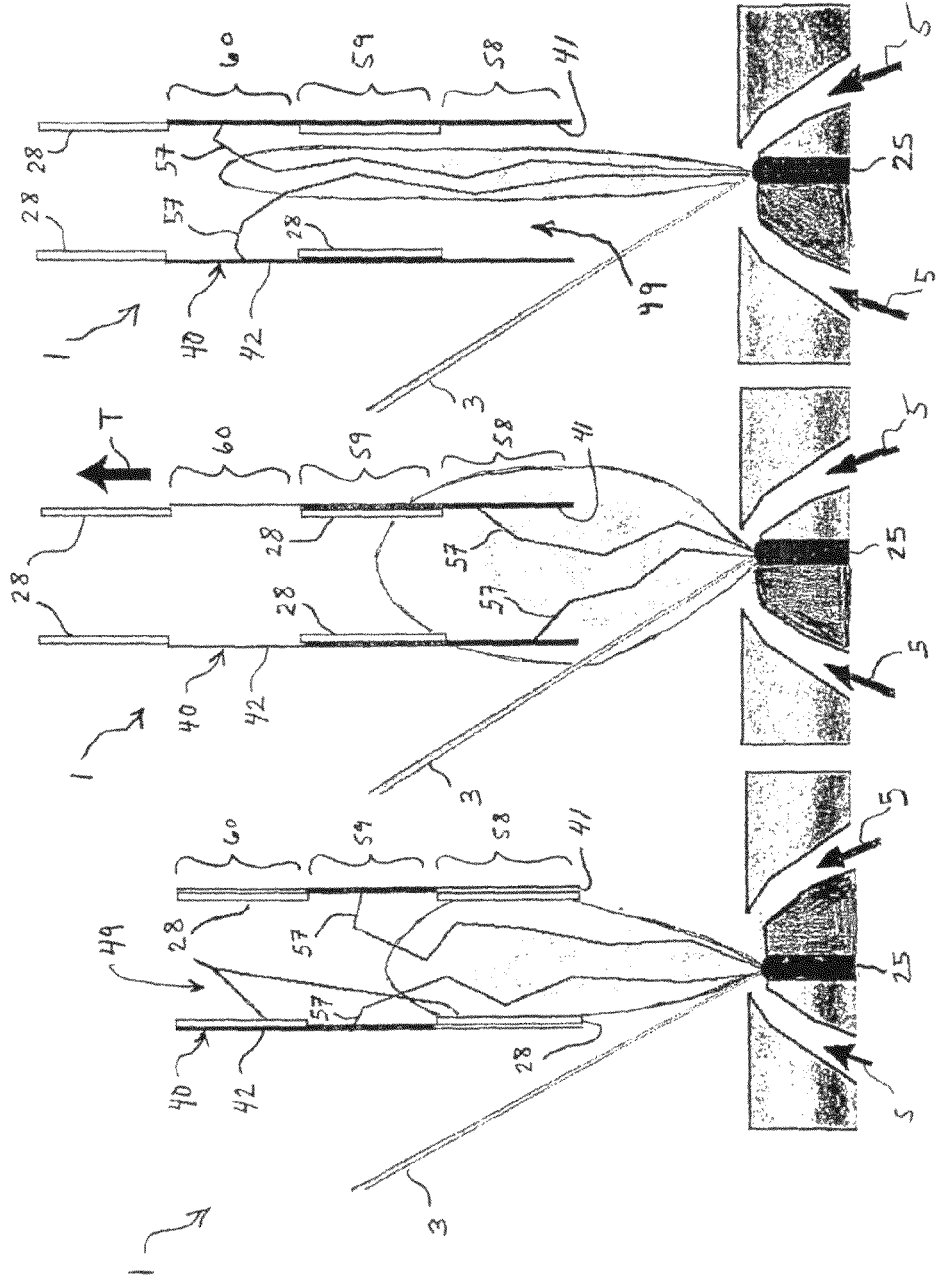

APPARATUS AND METHOD FOR APPLYING COATINGS ONTO THE INTERIOR SURFACES OF COMPONENTS AND RELATED STRUCTURES PRODUCED THEREFROM

CROSS-REFERENCES TO RELATED APPLICATIONS

This application is a national stage filing of International Application No. PCT/US2005/000606, filed on 10 Jan. 2005, which claims priority benefit under 35 U.S.C Section 119(e) from U.S. Provisional Patent Application Ser. No. 60/535,442, filed Jan. 8, 2004, entitled "Method and System for Applying Coatings onto the Interior Surfaces of Components," and Application Ser. No. 60/637,522, filed Dec. 20, 2004, entitled "Method and System for Applying Coatings onto the Interior Surfaces of Components and Resultant Structure there from," the entire disclosures of which are hereby incorporated by reference herein in their entirety.

US GOVERNMENT RIGHTS

This invention was made with United States Government support under Grant No. FA8201-04-P-2018, awarded by the United States Air Force. The United States Government has certain rights in the invention.

FIELD OF THE INVENTION

The present invention provides a method and an apparatus for efficiently applying a coating to a component by creating an atomic vapor flux, and more particularly coating the interior of a component or any desired regions thereof.

BACKGROUND OF THE INVENTION

The useful lifetime of small and medium diameter (20 to 40 mm) gun barrels is limited by damage of the interior surfaces resulting from mechanical and thermochemical effects related to passing a projectile through the gun bore and subsequent exposure of the interior surface to hot propellant gases. Coatings to protect the interior surfaces of the barrel are therefore frequently employed. Traditionally, the gun barrels have contained chromium coatings that are applied on the interior surface via electroplating. These coatings provide adequate performance; unfortunately hexalavent chrome is created during the electrodeposition process. This material is toxic and difficult to dispose of. Executive Order EO13148 requires the usage reduction of hexavalent chrome (the primary element of electro-deposition) by 50% before the end of 2006. New deposition approaches for wear resistant coatings are therefore desired that retain the high throwing power and affordable cost structure of electroplated chrome but are inherently environmentally safe.

Several other deposition options for protective coatings currently exist. These include approaches such as thermal spraying, chemical vapor deposition (CVD) and the various physical vapor deposition (PVD) approaches. The internal surfaces, however, are hidden or limited from sight making the coating of internal surfaces with very uniform thickness distribution and a high quality microstructure very difficult or impossible. While high pressure CVD using metal-organic precursors may at first provide a promising approach, non-uniform deposition, vapor toxicity issues and low deposition rates plague this approach. Thus, the desired combination of non-line-of-sight coating capability, limited-line-of sight capability, high deposition uniformity, environmental inertness and compositional flexibility required has been difficult to achieve.

Perhaps the most promising approach is PVD. These approaches are growing in interest for many applications because they are environmentally friendly, allow adequate materials flexibility and enable the deposition of high quality, thin films. In most PVD based processing approaches, however, it is not possible to uniformly coat the interior of hollow tubular substrates without spatially distributed sources (such as cylindrical magnetron sputtering (CMS) where source targets are inserted into the interior of the part). This arises because the vapor atoms are created in a high vacuum that results in nearly collisionless vapor transport to the substrate. As a result, only regions in the line-of-sight of the vapor source are coated. Even for the cases of thin films deposited with cylindrical magnetron sputtering, deposition rates are relatively low and the vacuum requirements are stringent ($<10^{-4}$ Pa) so that the cost effectiveness of these approaches in relation to electroplating is in question. In addition, the ability of these processes to deposit coatings into the grooves found in rifled gun barrels is also an issue. Nevertheless, this PVD approach still appears to be one option for coating large diameter gun barrels (>40 mm). Its application to smaller diameters, however, is not feasible because of issues related to the stability of the ionization and deposition processes involved.

Thus, the advent of a new deposition process that improves upon the economic and the line-of-sight limitations of current PVD approaches (such as CMS) while retaining their many advantages is of interest for applications such as gun barrel coatings, the coating of other tubular substrates and other components having an interior region or integral parts.

Other applications, for example and not limited thereto, that would benefit from such advancement include wear and corrosion resistant coatings for the interior surfaces of aircraft landing gear components, wear resistant coatings for actuators in suspension control systems used on automobiles, hydraulic and pneumatic actuators, linear electric motors and the internal surfaces of bearings.

SUMMARY OF INVENTION

An aspect of an embodiment of the present invention provides a methodology and system for applying coatings onto the interior surfaces of components. The approach comprises a vapor creation device (for example an electron beam or laser that evaporates a single or multiplicity of solid or liquid sources), a vacuum chamber having a moderate gas pressure (between about $10^{-4}$ to about $10^3$ Torr) and a inert gas jet having controlled velocity and flow fields of gas jet. The gas jet is created by a rarefied, inert gas supersonic expansion through a nozzle. By controlling the carrier gas flow into a region upstream of the nozzle an upstream pressure is achieved (i.e. the gas pressure prior to its entrance into the processing chamber through the nozzle). The carrier gas flow and chamber pumping rate control the downstream (or chamber) pressure (downstream of the nozzle). The ratio of the upstream to downstream pressure along with the size and shape of the nozzle opening controls the speed of the gas entering the chamber. The carrier gas molecular weight (compared to that of the vapor) and the carrier gas speed controls its effectiveness in redirecting the vapor atoms via binary collisions towards the substrate. The speed and flux of the atoms entering the chamber, the nozzle parameters, and the operating chamber pressure can all be varied leading to a wide range of accessible processing conditions. Vapor created from a source is transported into the interior regions of a component using binary collisions between the vapor and gas jet atoms. Under certain process conditions these collisions enable the vapor atoms to scatter onto the interior surfaces of the component and deposit.

Some aspects regarding the various embodiments of the present invention method and apparatus, and components produced there from, include a deposition approach by creating an atomic vapor flux, using a number of possible means including an electron beam or energetic source. The atomic vapor flux is focused (to some desired or required dimension) using a supersonic gas jet created with a carrier gas, wherein the following parameters are set accordingly: 1) upstream pressure, 2) pressure ratio, 3) carrier gas type and/or 4) nozzle area.

In some embodiments, the method and apparatus includes directing the focused vapor flux into an internal region of the component (or any exterior region if required or desired) so as to infiltrate the interior of the component (i.e., substrate). The infiltration will depend on, but not limited thereto, the area of the focused vapor flux and the distance away from the nozzle that the flux remains focused (i.e., focus distance). If desired the area of the focused vapor flux can be provided to be less than the area of the internal region of the substrate (component) or alternatively vapor flux area may be equal to or greater. Next, the vapor flux will become defocused as the jet will only remain focused for a given distance. The defocus vapor flux may be the result of, for example, loss of gas jet energy, based on gas jet properties or the use of a foreign object, such as a deflector member, secondary jet, and/or baffle. With regards to depositing the vapor flux on the interior surfaces of the component (or other desired regions) the vapor atom impact angle should on average be near the surface normal to achieve optimum results.

In some embodiments, the method and apparatus includes controlling the thickness uniformity of the coating being deposited on the component. The control of thickness uniformity may be achieved using, but not limited thereto, the following methods 1) controlling the focus distance, such as by adjusting the upstream pressure, pressure ratio, carrier gas type and/or nozzle area, 2) flipping the component with a 180° flip or as required, 3) moving a deflector member, 4) moving a deflector comprising secondary jets, and/or 5) moving a baffle.

In some embodiments, the method and apparatus includes a single step external/internal coating of the component. The external/internal coating may be achieved with a single nozzle or multiple nozzles. The single step coating may include one (or more) different compositions, one (or more) different internal regions, and/or one (or more) external regions.

In some embodiments, the method and apparatus include coating of very large parts using an internal crucible wherein the component or container functions as the crucible itself.

An aspect of an embodiment of the present invention includes providing a vertically translatable deflector plate, secondary gas jets, and/or baffle for uniquely controlling the thickness uniformity and microstructure of the coating.

An aspect of an embodiment of the present invention includes the ability to deposit monolithic metals or alloys, multilayer coatings, functionally graded coatings and nanoscale composite coatings onto interior surfaces.

Various embodiments of the present invention method and system approach are environmentally friendly and potentially low cost.

An aspect of an embodiment of the present invention provides a method for applying at least one coating on at least one substrate. The method comprising: a) presenting at least one of the substrate to a chamber; the chamber having a down stream pressure, Pc, with an operating range from about $10^{-4}$ to about $10^3$ Torr; b) presenting at least one evaporant source to the chamber; c) presenting primary carrier gas streams comprised of gas molecules to the chamber; and d) impinging at least one the evaporant source with at least one energetic beam in the chamber to generate an evaporated vapor flux comprised of evaporant molecules. The substrate includes a distal end and a proximal end defining a longitudinal section there between, and wherein the substrate has an interior cavity. Further, the primary carrier gas streams deflects at least a portion of at least one of the generated evaporated vapor flux by the primary carrier gas streams into the interior cavity of the substrate thereby coating at least a portion of interior of the longitudinal section.

An aspect of an embodiment of the present invention also provides a substrate having at least one coating on a non-line of sight region and/or a limited line of sight region of the substrate, manufactured by the method discussed immediately above.

An aspect of an embodiment of the present invention provides an apparatus for applying at least one coating on at least one substrate. The apparatus comprising: a chamber, wherein the chamber has a down stream pressure, Pc, with an operating range from about $10^{-4}$ to about $10^3$ Torr. The substrate is presented to the chamber. The substrate has a distal end and a proximal end defining a longitudinal section there between, wherein the substrate has an interior cavity. The apparatus further comprises a) at least one eavaporant source disposed in the chamber b) primary carrier gas streams comprised of gas molecules provided in the chamber and c) at least one energetic beam. The energetic beam impinges the evaporant source and generates an evaporated vapor flux comprised of evaporant molecules. The primary carrier gas streams deflects at least a portion of at least one of the generated evaporated vapor flux by the primary carrier gas streams into the interior cavity of the substrate thereby coating at least a portion of interior of the longitudinal section.

An aspect of an embodiment of the present invention also provides a substrate having at least one coating on a non-line of sight region and/or a limited line of sight region of the substrate, manufactured by the apparatus discussed immediately above.

These and other objects, along with advantages and features of the embodiments of the invention disclosed herein, will be made more apparent from the description, drawings and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings in which:

FIGS. 4(A)-(C) schematically illustrate a diagram of a partial DVD apparatus of an aspect of an embodiment of the present invention demonstrating select and non-limiting process steps of depositing vapor.

FIGS. 6(A)-(C) schematically illustrate the effects of the nozzle and source size on the vapor flux diameter and the focused distance, D.

FIGS. 7(A)-(B) schematically illustrate effects of altering the process parameters regarding coating distribution and infiltration.

FIGS. 9(A)-(B) is photographic depiction of a 6" long, 3" diameter aluminum tube that was coated with aluminum using the DVD approach of FIG. 8. FIG. 9(A) represents a side perspective view of the tube while FIG. 9(B) represents a top perspective view of a partial portion of the tube of FIG. 9(A).

FIG. 10 is a graphical depiction of coating thickness distribution for aluminum deposition along a 3 inch diameter, 6 inch long tube using different carrier gas flow rates using the DVD approach of FIG. 8.

FIGS. 23(A)-(C) schematically illustrate exemplary embodiments of the present invention deposition apparatus (partial view) in operation utilizing a mask technique and/or altering process parameters for coating various regions or substrates.

DETAILED DESCRIPTION OF THE INVENTION

Figure 1:
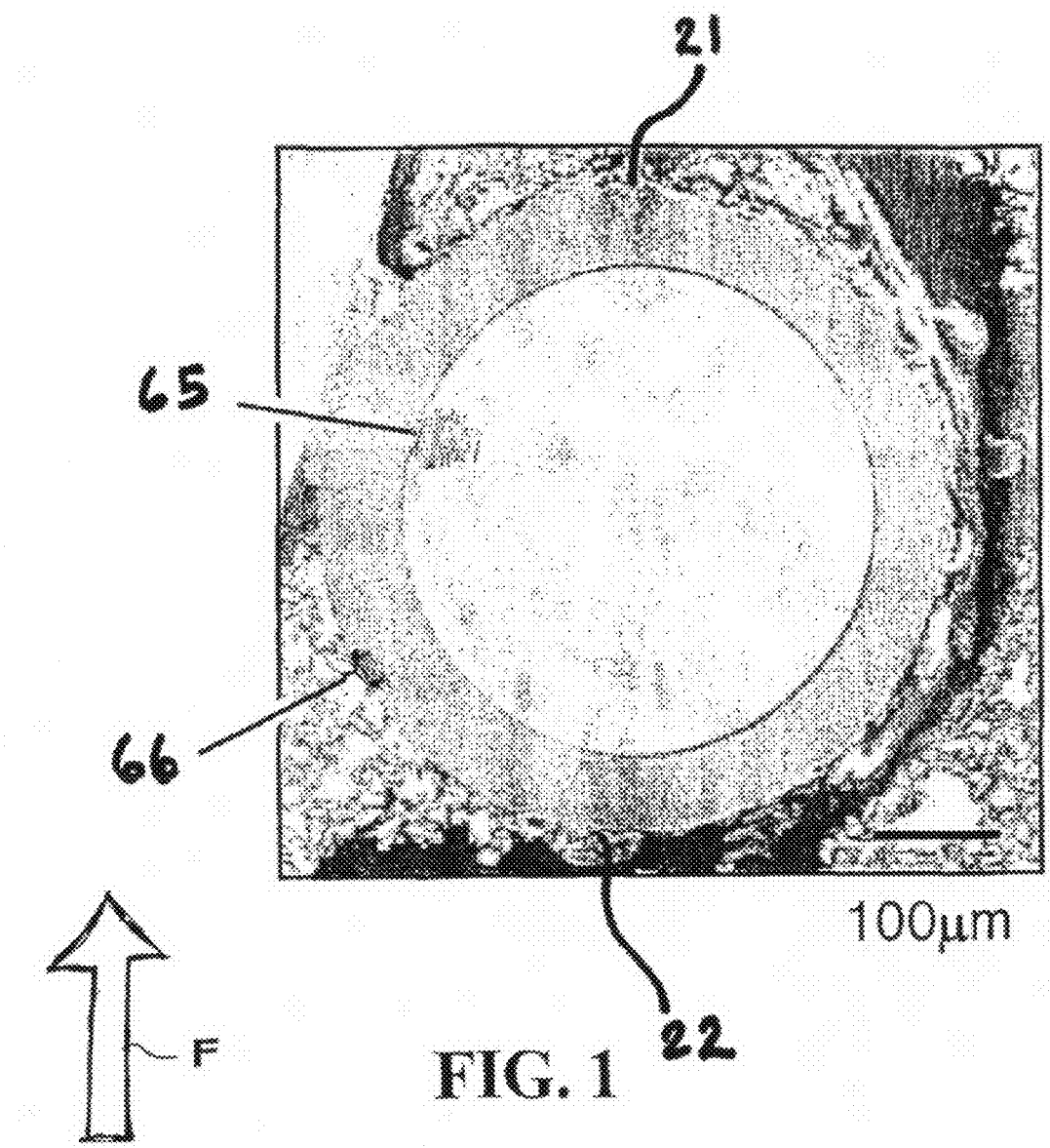
FIG. 1 represents a micrographic depiction of a coating on the stationary fiber substrate.

In general, physical vapor deposition processes can be considered as multi-step processes; a) vapor creation, b) vapor transport, c) vapor adatom adsorption and d) assembly on the substrate (component). Methodologies for the creation of the vapor are many and have been widely researched as has the assembly processes at the substrate. There is, however, a need for, among other things, an improved control of the vapor transport processes that enable increased process efficiency, improved composition control, limited-line-of-sight (LLOS) and non-line-of-sight (NLOS) deposition. Such attributes would promise to greatly improve the economy of PVD processes and other process types and its potential range of applications.

One approach of an aspect of an embodiment of the present invention is to alter the vapor transport step through the use of binary collisions between vapor atoms and a moving background gas. This is enabled by the use of certain chamber pressures to control the mean free path between vapor atom/background (carrier) gas collisions and to alter the speed of the gas jet. The result is that several aspects of the vapor transport step can be beneficially controlled. These include the ability to tailor the spread of a thermally evaporated flux to the size of the desired substrate/component (or regions thereof to increase deposition rates or to be smaller than the size of an opening into an interior region or cavity to enable the transport of the vapor into the internal regions or cavities of the component, the ability to deposit materials onto non-line-of-sight (NLOS) regions or limited-line-of-sight (LLOS) regions or cavities of substrates (components) and the ability to control the intermixing between multiple vapor sources.

It should be appreciated that any interior region or cavity as discussed through out may be a number of structures including, but not limited thereto, the following: recess, aperture, port, duct, trough, bore, inlet, outlet, uptake, intake, hole, conduit, perforation, channel, groove, socket, seat, passage, pipe, indentation, pocket, sink, cell, slot, hollow-out-portion, sieve, orifice, flute, chamber, well, tunnel, or channel, as well as combination thereof.

Additional capabilities of aspects of some embodiments of the present invention may include the use of high frequency e-beam scanning (e.g., 100 kHz) that allows multiple source rods to be simultaneously evaporated. By using the binary collisions between the gas jet atoms and the vapor, the fluxes are intermixed enabling the composition of the vapor flux (and thus, the coating) to be uniquely controlled. Multilayer or functionally graded coatings can be created by adding a given e-beam dwell time onto two or more of the source materials.

To enable dense coatings of high melting point materials at low substrate temperatures hollow cathode plasma activation can also successfully be used in this process environment of some aspects of embodiments of the present invention. This enables a large percentage of all gas and vapor species to be ionized. The ions can then be accelerated towards the coating surface by an applied electrical potential increasing the velocity (and thus the kinetic energy) of the ions allowing the coating density to be increased.

When using the DVD approach as a means for obtaining non-line of sight (NLOS) coating or limited line of sight (LLOS) coating (such as the case for gun barrel coatings, but not limited thereto) of various embodiments of the present invention, chamber pressures are chosen to allow some binary collisions between the vapor and gas jet atoms to enable a mechanism to control the trajectories of the vapor atoms, but not three body collisions that enable the nucleation of clusters that can detrimentally affect the coating microstructure. As shown in FIG. 1, significant coating 66 on the NLOS region 21 has been observed when coating stationary fiber substrates 65 since the gas jet (having, for example, a flow in the general direction of the arrow designated as F) could be used to transport vapor atoms to the backside (NLOS region 21) of the fiber substrate 65 where they could deposit via scattering. It should be appreciated that coating 66 on the LOS region 22 (front side) is accomplished as well. In this specific exemplary embodiment, aluminum coating is deposited onto a stationary steel fiber 65 using a DVD apparatus. Significant NLOS coating was achieved on the backside of the fiber (70% of the front side). The coating morphology was found to be similar on all regions.

As will be discussed in greater detail below, an aspect of some embodiments of the present invention system and method allow coating onto the interior surfaces of a tube or component. Vapor atoms are created using e-gun evaporation and then focused into the tube or component using a carrier gas where they deposit on the interior via lateral diffusion within the gas flow. In such an example, the average carrier gas trajectories are parallel to the walls of the tube or component. However, when the process conditions are set so that vapor atoms have a "random walk" aspect to their motion wherein the vapor atoms only generally follow the carrier gas trajectories and can laterally diffuse via binary collisions.

Control of the vapor atom diffusion process is important with regards to the successful deposition of high quality, uniform coatings on the interior of these parts (components) and is accomplished by, for example, the control of the speed and density of the background gas. When the Knudsen number (i.e. the ratio between the mean free path in a flow to the characteristic length of a body (affected region) immersed in the flow) for the carrier gas is about equal to or less than 1 and the gas speed is highly subsonic (approximately <200 m/s) the vapor atoms can diffuse laterally and impact the tube walls with an incidence angle near the substrate normal. Since the carrier gas speed affects the lateral diffusion distances, gradients in the speed from the tube entrance to the tube exit can be used to control the coating thickness uniformity throughout the length of the tube.

Another aspect of some embodiments of the present invention demonstrates that the control of the gas speed can also prevent vapor atoms from impacting the surface at oblique angles. Oblique impacts promote shadowing mechanisms that lead to unwanted porosity in the coatings and thus need to be prevented.

An aspect of an embodiment of the present invention provides a method and an apparatus for efficiently applying a coating to a component by creating an atomic vapor flux, and in certain instances coating the interior of a component as well as other desired regions.

Another embodiment of the present invention process provides for, among other things, coating the interior regions of a component so as to 1) create a focused vapor flux using a gas jet, 2) infiltrate the vapor flux into the interior region of the component and 3) allow the vapor flux to defocus at the location where deposition is desired to occur on the component.

Figure 2A:
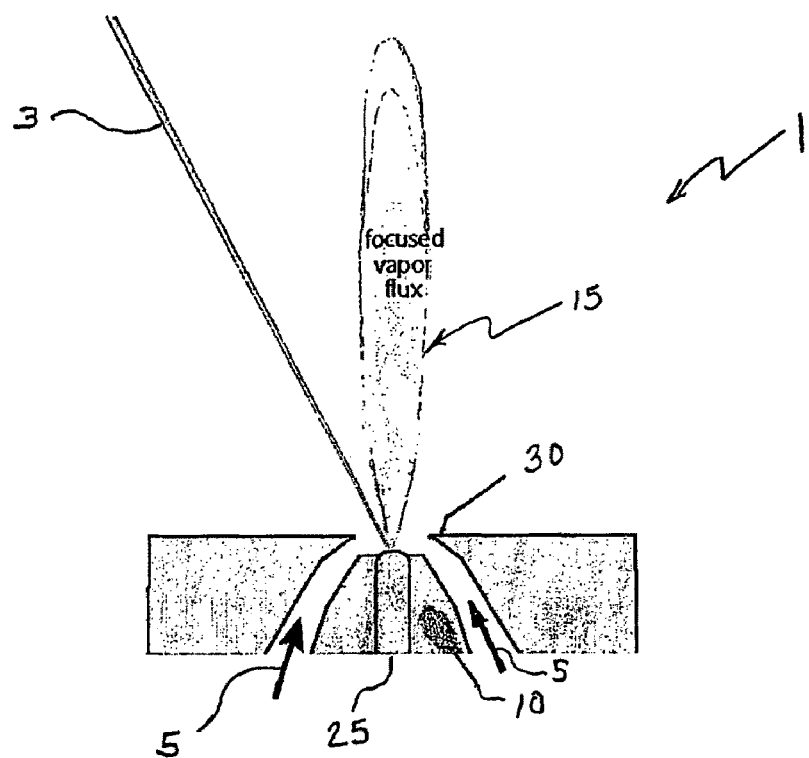
FIGS. 2(A)-(B) schematically illustrate diagrams of a partial atomic deposition apparatus such as a DVD apparatus illustrating an aspect of two embodiments of the present invention.
Figure 2B:
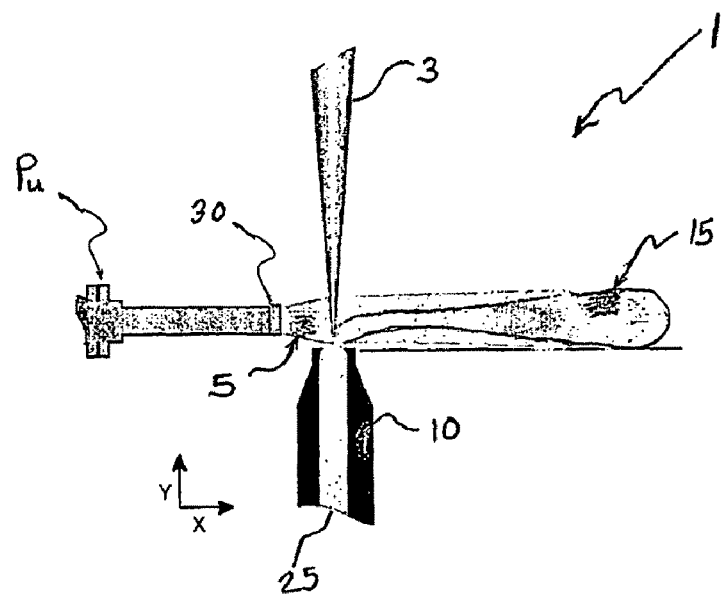

Referring to FIG. 2(A), FIG. 2(A) schematically illustrates a diagram of a partial atomic deposition apparatus such as a DVD apparatus 1 illustrating an aspect of an embodiment of the present invention. The focused vapor flux 15 is created by evaporating a material 25 using an energetic beam/source 3 and controlling the trajectory of vapor atoms using a supersonic gas jet 5. The gas jet 5 is typically introduced either by surrounding the crucible 10 with the gas jet 5 through the nozzle 30 (for example, choked nozzle) as shown, or alternatively, using a separate nozzle 30 as shown in FIG. 2(B). The jet 5 is created by flowing a given volume of a carrier gas 5 into an area having a higher pressure than the pressure in the working chamber (not shown). The opening between the two pressures (the nozzle and down stream pressure) chokes the flow and results in a gas jet 5 of a given velocity and density. The supersonic gas jet atoms collide with the vapor atoms of the vapor flux 15 and focus them in the direction of the gas jet 5.

Figures 3A, 3B:
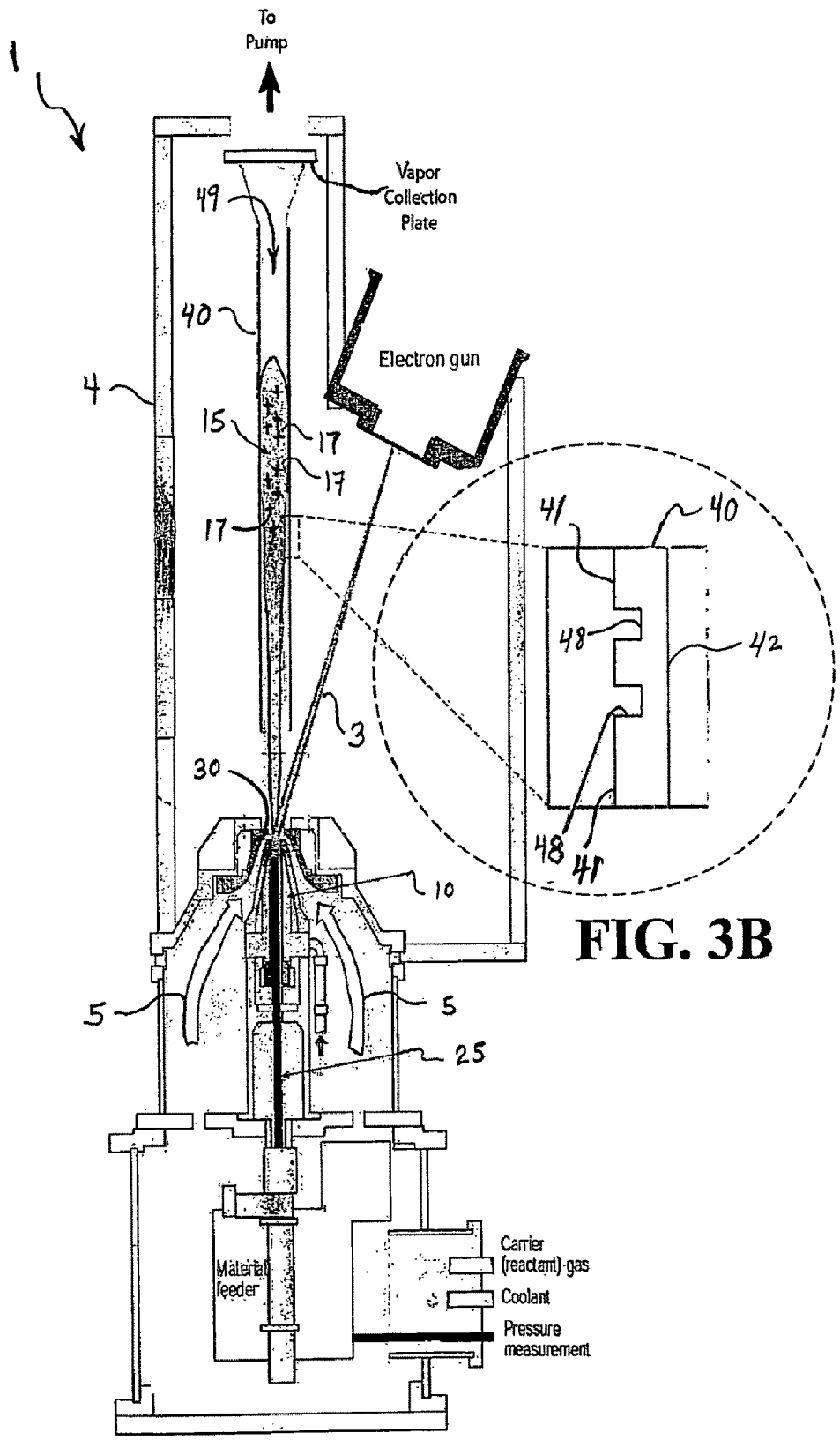
FIG. 3(A) schematically illustrates an exemplary embodiment of the present invention deposition apparatus in operation.
FIG. 3B is a schematic illustration of an enlarged view of a portion of the wall of the component shown in FIG. 3(A).

Turning to FIG. 3(A), FIG. 3(A) depicts an exemplary embodiment of the present invention apparatus in operation. In the exemplified DVD apparatus 1, material 25 is vaporized using an energetic beam 3 such as a continuous high voltage/medium power (e.g., 70 kV/10 KW) axial e-beam gun (modified to function in a low vacuum environment by incorporating differential pumping of the gun column and the use of a very small (approximately 3 mm) e-beam exit opening). It should be appreciated that various energetic beams may be utilized in addition to an electron beam, such as a laser source, heat source, ion bombardment source, or highly focused incoherent light source, microwave, radio frequency, EMF, or any energetic beam that break chemical bonds, or combination thereof. The vapor flux 15 comprised of, for example, aluminum molecules 17 (i.e., evaporant molecules/vapor molecules) is focused by a carrier gas 5 and directed into or proximal to a component 40 (i.e., object, target or substrate) or any region(s) thereof. The carrier gas jet 5 is created by a rarefied, inert gas supersonic expansion through a nozzle 30. This process may be accomplished by maintaining a high pressure upstream of the nozzle opening, $P_u$, and a lower downstream pressure (or chamber pressure), $P_0$. The pressure ratio, and the size and the shape of the nozzle opening control the speed of the gas entering the chamber. The low vacuum employed in this process results in a short mean free path between collisions of vapor and carrier gas atoms. This condition, combined with the ability to flow the carrier gas over the surface of a complex shaped object (component 40) sets up the possibility of non-line-of-sight (NLOS) coating and limited-line-of-sight (LLOS) coating. The NLOS and LLOS coating in this instance is defined by the interior surface 41 of the wall 42 of the component 40. Depending on the actual alignment with the source 25 and the wall 42 any deposit location on the interior surface 41 of the wall 42 would be defined as not being in line of sight or very limited line of sight. It should be appreciated that various kinds of carrier gases may be used, such as but not limited thereto, any one of the following: He, Ar, Ne, Kr $O_2$, $N_2$, $NH_4$, $CH_4$, $H_2$, hydrocarbons, salines, and other inert gases, or various combinations thereof. In addition, it should be appreciated that a variety of deposition techniques, methods, and apparatus can be used to evaporate and deposit coating of the present invention. Such deposition techniques include, but not limited thereto, the following: evaporation (thermal, RF, laser, or electron beam), reactive evaporation, sputtering (DC, RF, microwave and/or magnetron), reactive sputtering, electron beam physical vapor deposition (EF-PVD), ion plasma deposition (IPD), low pressure plasma spray (LPPS), high velocity oxy-fuel (HVOF), vapor deposition, or cluster deposition. Moreover, it should be appreciated that the evaporant sources may comprise of a material comprising at least one of any metal, alloy, ceramic, semiconductor or polymer, as well as any combination thereof.

Turning to FIG. 3B, FIG. 3B is a schematic illustration of an enlarged view of a portion of the wall 42 of the component 40, such as a tube, wherein grooves 48 (such as ridges, trenches, channels, duct, trough, perforation, indentation, slot, or the like) are provided in the wall 42. It is quite likely that in this exemplary arrangement the surface of the grooves or at least a substantial portion thereof, is not in the line of sight with the evaporant source 25.

Moreover, it should be appreciated that the component 40 may be a variety of substrates, components or structures. Such examples of the component 40 (substrate, component, structure) included, but not limited thereto the following: casing, cylinder, drum, basket, receptacle, bin, box, collar, hamper, well, cell, cell-case, case, shell, hoop, cover, envelope, housing, enclosure, chamber, sleeve, holder, repository, shelter, body, or bowl, as well as any combination thereof.

Moreover, it should be appreciated that the wall 42 (longitudinal section) or portion thereof (longitudinal section) may comprise a variety of surfaces including, but not limited thereto: planar surface, indented surface, convex surface, concave surface, ridged surface, corrugated surface, grooved surface, curved surface, multi-contoured surface, core comprised of truss units or truss-like units, core of textile layers or textile like layers, multi-channel surface, porous structure, or micro-porous structure.

Moreover, it should be appreciated the tube may be a number of devices including, but not limited thereto, the following: hose, conduit, cable, stem, collet, flange, thimble, ring, ferrule, bushing, collar, nipple, or sleeve, as well as a combination thereof.

In operation, an embodiment of the present invention apparatus and method provides a carrier gas flow 5 that entrains vapor atoms 17 that are allowed for the coating of regions on a component 40 that are not in line-of-sight (NLOS) and limited-line-of-sight (LLOS), as well as line-of-sight (LOS). The degree of non-line-of-sight coating and limited-line-of-sight coating and thus, the thickness uniformity on the component is a sensitive function of the flow conditions. This embodiment of the present invention directed vapor deposition (DVD) method and system provides the technical basis for a flexible, high quality coating process capable of atomistically depositing dense, compositionally controlled coatings onto line-of-sight (LOS), limited-line-of-sight (LLOS) and non line-of-sight (NLOS) regions of components. An embodiment of this DVD technology of the present invention utilizes a gas jet to direct and transport a thermally evaporated vapor cloud onto a substrate (component). The vapor is deposited with a high materials utilization efficiency resulting in high deposition rates (e.g., approximately >10 µm min$^{-1}$). Typical operating pressures are approximately in the 1 to 50 Pa range (i.e., about $7.5 \times 10^{-3}$ to 0.375 torr), but may also include the range of about $10^{-4}$ to about $10^3$ torr. Other alternative ranges include, but not limited thereto, the following: about $10^{-3}$ to about $10^2$ torr, about $10^{-2}$ to about 10 torr, about 0.1 torr to about 1 torr, about 0.05 to about 0.5 torr, to about 0.025 torr to about 0.3 torr. It should be appreciated that the operating pressures may be less than $10^{-4}$ or greater than $10^3$ torr. Thus, only inexpensive mechanical pumping is required. In this pressure regime, collisions between the vapor atoms and the gas jet create a mechanism for transporting the vapor atoms into regions of components that are not in the line-of-sight or limited-line-of sight of the source and then scattering them onto these surfaces to result in NLOS and/or LLOS deposition.

Practice of the invention will be still more fully understood from the examples and embodiments discussed throughout this document, which are presented herein for illustration only and should not be construed as limiting the invention in any way.

Referring to FIGS. 4(A)-(C), FIGS. 4(A)-(C) schematically illustrate a diagram of a partial DVD apparatus 1 of an aspect of an embodiment of the present invention. Briefly, some select and non-limiting process steps of depositing vapor is illustrated in FIGS. 4(A)-(C). The focused vapor flux 15, as shown in FIG. 4(A), is infiltrated into the interior cavity 49 of the component 40, as shown in FIG. 4(B), by directing the vapor flux 15 into an opening 45 of the component 40. An example of an "opening," but not limited thereto, is one end of a tube. At some distance into the component 40 the vapor flux 15 will become defocused (generally shown as the defocused region, DF) due to the loss of energy of the gas jet 5 at which point deposition will occur on the interior surface 41 of the walls 42 of the component 40 as the vapor atoms 17 scatter outward. In this region the vapor atoms impact the walls 42 at near normal angles of incidence as shown by the vapor atom trajectories 57 to promote good coating microstructures. By controlling the distance of the vapor flux focus the coating thickness distribution can be controlled. This can be done by altering the parameters that control the gas jet focal distance (as shown by the arrow designated as D) or through the introduction of a foreign object (such as a gas jet deflector, secondary gas jet or baffle as will be discussed later).

Figures 5A, 5B:
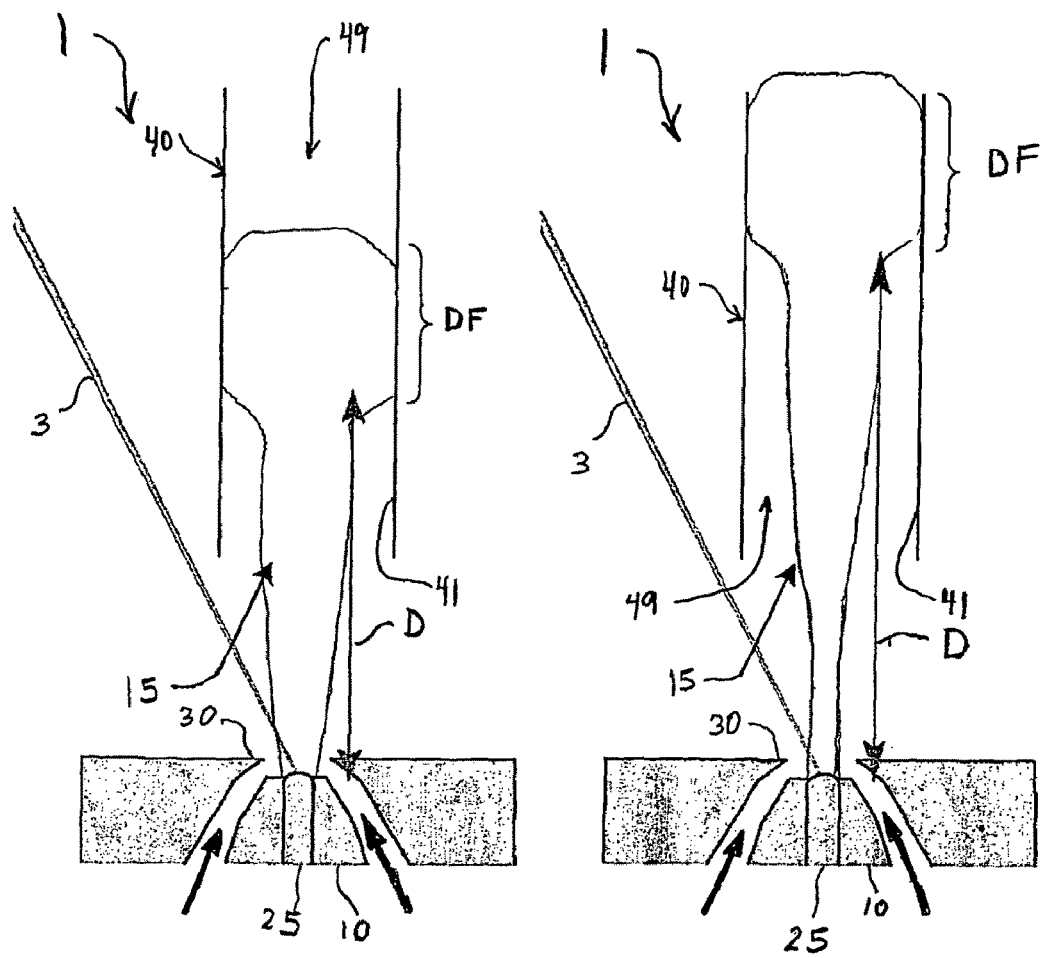
FIGS. 5(A)-(B) schematically illustrate effects of altering the location of the de-focused region DF on the coating distribution.

Next, some illustrative effects of altering the location of the de-focused region DF on the coating distribution are shown in FIGS. 5(A)-(B). At some distance into the component 40 the vapor flux 15 will become defocused due to the loss of energy of the gas jet 5 at which point deposition will occur on the interior 41 of the walls 42 of the component 40 as the vapor atoms scatter outward, as shown in FIG. 5(A). In this de-focused region DF the vapor atoms impact the walls 42 at near normal angles of incidence to promote good coating microstructures. The de-focused region, DF, also defines the deposition zone of the wall 42. Next, FIG. 5(B) illustrates that a change in the location of the de-focused region, designated as DF, of the vapor flux where NLOS deposition and/or LLOS deposition occurs when the gas jet pressure ratio and/or upstream pressure is increased. As a result the focused distance D is increased compared to the focused distance D shown in FIG. 5(A).

Figure 8:
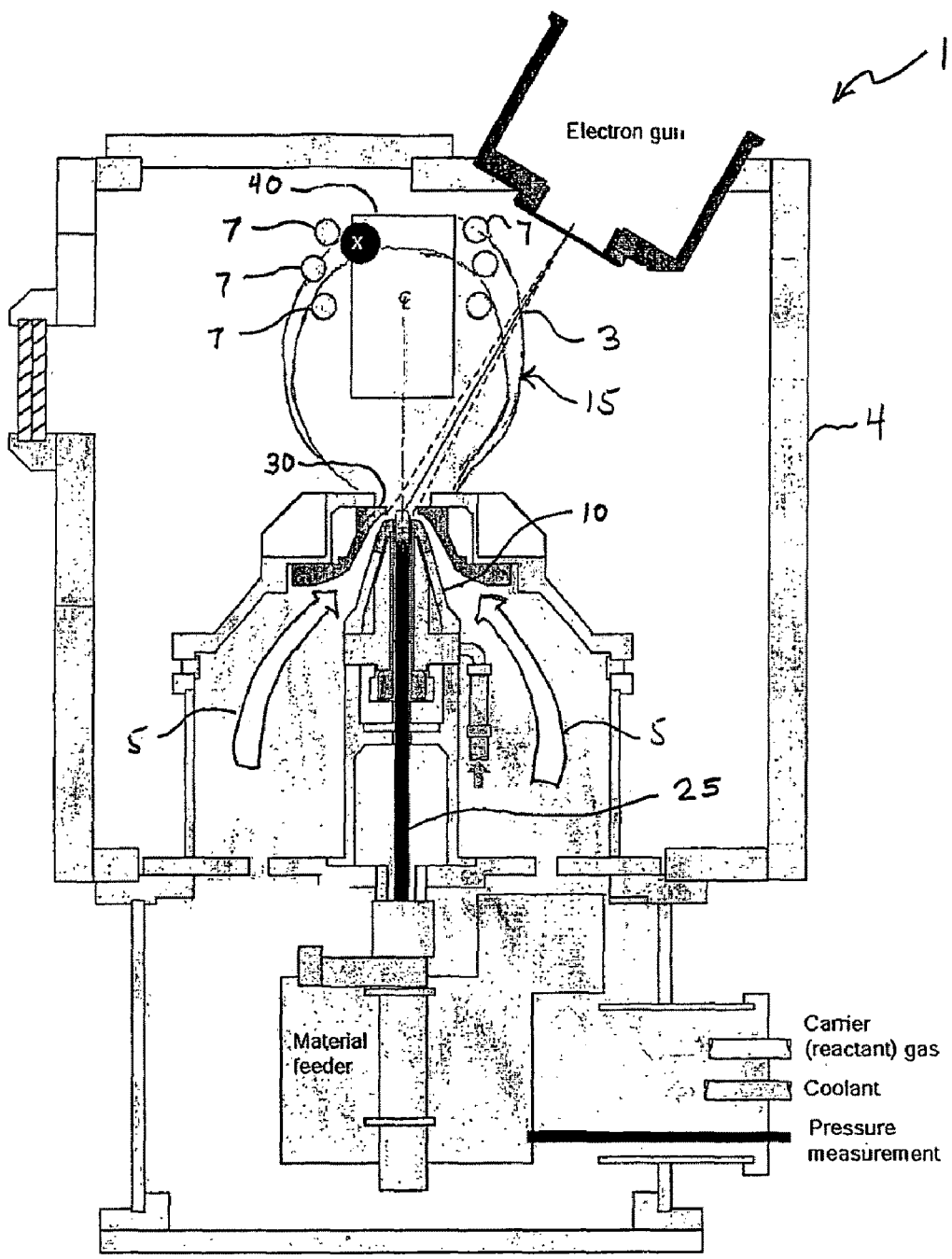
FIG. 8 schematic illustrates the DVD process that was used for depositing coatings in a particular example.
Figure 11A:
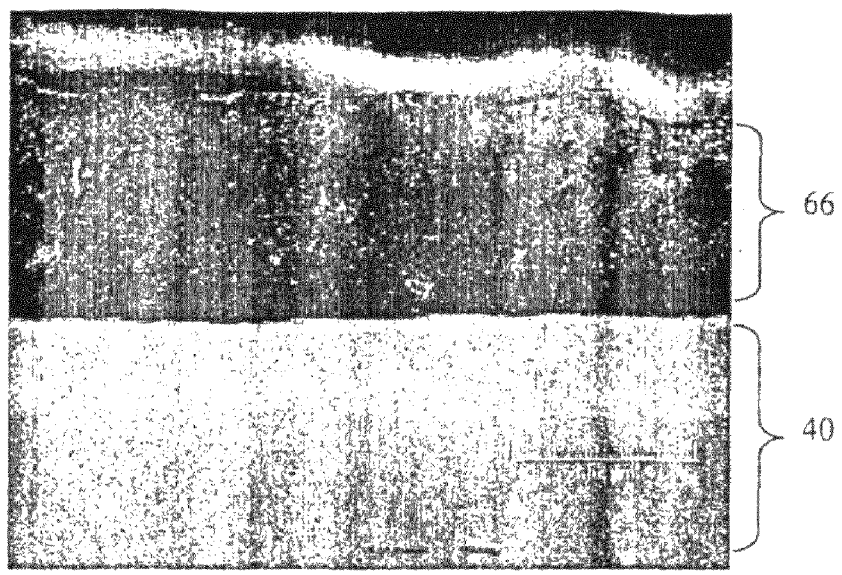
FIGS. 11(A)-(B) are SEM micrographic depictions showing the microstructure of the aluminum coating on the component/substrate (located at the position marked x in FIG. 8) whereby the aluminum coatings were deposited using a 10 slm helium carrier gas flow and a 20 slm helium carrier gas flow, respectively.
Figure 11B:
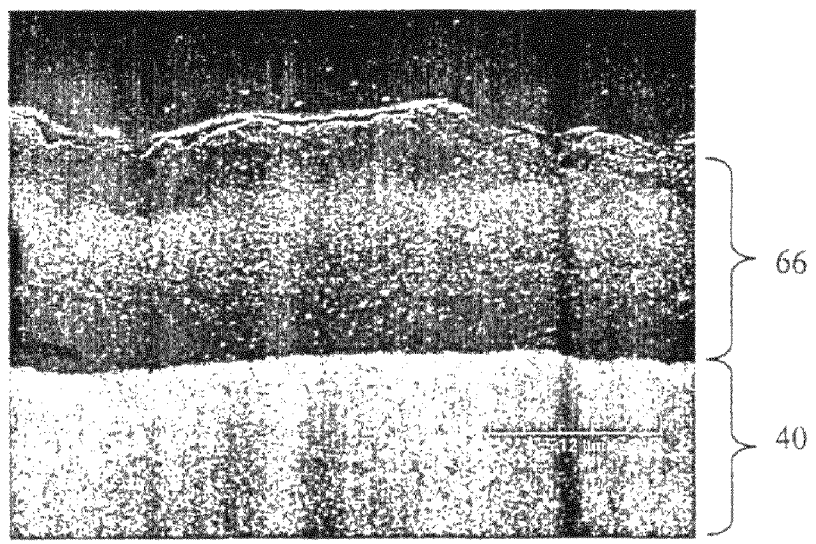

Referring to FIGS. 6(A)-(C), FIGS. 6(A)-(C) schematically illustrate the effects of the nozzle and source size on the vapor flux diameter and the focused distance, D. The ability to focus a vapor flux is dependant on the properties of the gas jet (such as its velocity and density, which are controlled by many parameters) and the diameter of the nozzle opening and the vapor source rod. To achieve the maximum focus for the longest distance away from the nozzle 30 the following parameters should be maximized: pressure upstream of the nozzle choke point, gas jet pressure ratio (i.e. the pressure upstream of the nozzle choke point/the pressure downstream of the nozzle choke point) and the molecular weight of the carrier gas atoms (for example, but not limited thereto, the carrier gas atoms having an atomic weight in the range of about 1 to about 222 grams/mole). The range of the downstream pressure and pressure ratio will define the upstream. For example, if the downstream pressure range to 1 to 50 Pa and the pressure ratio is 2 to 100 then the upstream pressure range would be 2 to 5000 Pa. The pressure ratio in some embodiments of the present invention having a range of about 2 to infinite. Other available pressure ratios range from about 2 to about 100, about 4 to about 20, or about 5 to about 10, as well as other ranges as desired or required. The smaller the size of the nozzle opening 31 of the gas jet 5 the smaller the diameter of the vapor flux 15 can potentially be. However, as the nozzle diameter is decreased, the distance away from the nozzle that the vapor flux remains focused is also reduced. Thus, the smaller the nozzle diameter the higher the parameters above (i.e. the upstream pressure and the pressure ratio) must be to keep the vapor focused for a given distance. For instance, referring to FIG. 6(A), a given set of process conditions are used to infiltrate vapor 15 into the interior cavity 49 of a tube 40 (component or structure) and deposit the vapor onto the interior surface 41 of the walls 42. Next, referring to FIG. 6(B), a smaller nozzle size is used allowing a smaller vapor flux diameter, but also a smaller focused distance, D. Further, referring to FIG. 6(C), the small nozzle size is used along with an increased pressure ratio to result in a longer focused distance, D.

The infiltration of the vapor flux 15 into the interior cavities 49 of components 40 is dependant upon the ability to focus the vapor flux 15 into a tightly focused beam (having a small diameter). The vapor flux diameter should preferably be smaller than the smallest dimension of the opening 45 through which infiltration is occurring. If this is not the case a smaller diameter vapor flux can be achieved by using a higher upstream pressure (i.e. by inputting the gas used to create the jet into the nozzle at a higher rate), heavier carrier gas atoms (i.e. Argon vs. Helium), a higher pressure ratio and/or a smaller nozzle size.

However, as shown in FIG. 7(A), if the upstream pressure is too high for a given internal volume inside a component 40 the internal pressure within the component 40 will become too high to allow infiltration of the vapor flux 15. Thus, no internal coating or limited coating will occur. This can be avoided by reducing the upstream pressure, increasing the gas jet pressure ratio and/or further reducing the diameter of the nozzle 30, as shown in FIG. 7(B). If the gas jet area is larger than area of the opening 45 in the component 40, an increased pressure in the interior cavity 49 of the component can result which limits infiltration. If this occurs a more focused vapor flux and a reduced gas jet area are required.

Practice of the invention will be still more fully understood from the following examples, which are presented herein for illustration purposes only with the aid of FIGS. 8-11 and should not be construed as limiting the invention in any way. These examples of altering the gas jet process conditions to alter the coating thickness uniformity are provided as illustrative and non-limiting embodiments. Referring to FIG. 8, FIG. 8 is schematic illustration of the DVD process that will be used for depositing coatings in this example. Referring to FIGS. 9(A)-(B), FIGS. 9(A)-(B) is photographic depiction of a 6" long, 3" diameter aluminum tube that was coated with aluminum using the DVD approach of FIG. 8. FIG. 9(A) represents a side perspective view of the tube while FIG. 9(B) represents a top perspective view of a partial portion of the tube of FIG. 9(A). Both the interior surface 41 and exterior surface 43 were coated (in a single step) with the exception of region of the exterior surface shielded by the mechanism—providing the masked substrate region 24—used to hold the tube in the chamber. To determine the coating thickness along the length of the tube a 0.25 inch wide×6 inch long strip was cut out off the tube and then sectioned into 1 inch long pieces. Each piece was then mounted and polished. The coating thickness was then determined using an optical or scanning electron microscope. Data obtained is provided in the graph depicted in FIG. 10. FIG. 10 is a graphical depiction of coating thickness distribution for aluminum deposition along a 3 inch diameter, 6 inch long tube using different carrier gas flow rates. The coating thickness uniformity was a strong function of the flow rate of the carrier gas (which in turn alters the upstream pressure and, because the pressure ratio was fixed for this experiment, the chamber pressure). It should be noted that as the carrier gas flow rate was increased less coating occurred near the tube entrance and more coating occurred towards the tube exit. Still referring to FIG. 10, for the 10 standard liters per minute (slm) case (as represented by the diamond reference symbol), the coating was thickest near the tube entrance since the vapor flux was not strongly focused and NLOS, LLOS and LOS deposition occurred in this region. In contrast, the 20 slm case (as represented by the triangle reference symbol) had the least amount of coating near the tube entrance. This was because of the higher upstream Pu and chamber pressure Pc and increased gas jet velocity resulting from the increased carrier gas flow rate resulted in a more strongly focused vapor flux and a longer focus distance. The gas jet velocity reduced as the gas jet lost energy as it moved further from the vapor source. This lead to a defocusing of the gas jet and an increase in the probability of NLOS and LLOS coating deeper into the tube. This effect is balanced with the reduction in the vapor density with the distance from the vapor source (since vapor atoms are continuously depositing onto the tube surface) to determine the coating thickness in regions where primarily NLOS and LLOS coating occurs. Additionally, it should be appreciated that further increases to the carrier gas flow rate will continue along the general trend of reducing the relative coating thickness near the tube entrance and increasing the relative coating thickness near the tube exit. Accordingly, an aspect of an embodiment provides for increasing the gas jet focal distance by increasing the carrier gas stream flow rate or decreasing the pumping rate from the chamber, which both have the effect of increasing both the upstream and downstream pressures if the nozzle diameter is held constant. Reducing the pumping rate of the chamber can alter the gas jet focal distance by increasing both the upstream and downstream pressures if the nozzle diameter is held constant. Thus, these changes will produce similar effects as when altering the carrier gas stream flow rate.

The results shown here in this example are significant since they indicate that by altering the carrier gas flow rate the thickness uniformity of the coating can be controlled. For instance, by altering the gas flow rate during a given run using conditions having a known thickness distribution, the coating thickness can be engineered by controlling the coating time at each gas flow condition. The increased carrier gas jet had no effect on the coating microstructure. Both the lower gas flow rate (10 slm) and the higher gas flow rate (20 slm) resulted in dense coating microstructures, as shown in FIGS. 11(A) and (B), respectively. FIGS. 11(A)-(B) are SEM micrographic depictions showing the microstructure of the aluminum coating 66 on the component/substrate 40 (located at the position marked x in FIG. 8) whereby the aluminum coatings were deposited using a 10 slm helium carrier gas flow and a 20 slm helium carrier gas flow, respectively. It should be noted that both coatings appear completely dense.

Next, as will be discussed in greater detail below, other means may also be required to optimize the coating uniformity. These may include, but is not limited thereto, the following: a) reversing the entrance and exit (by rotating the tube 180°, for example) during the deposition process, b) using a vertically translatable deflector (such as a plate, cone or the like), c) using pulsed secondary jets moving in the opposite direction of the vapor flux, and/or d) using baffles near the tube walls which reduce the gas jet velocity and alter the flow field of the gas jet, for example.

Figure 13:
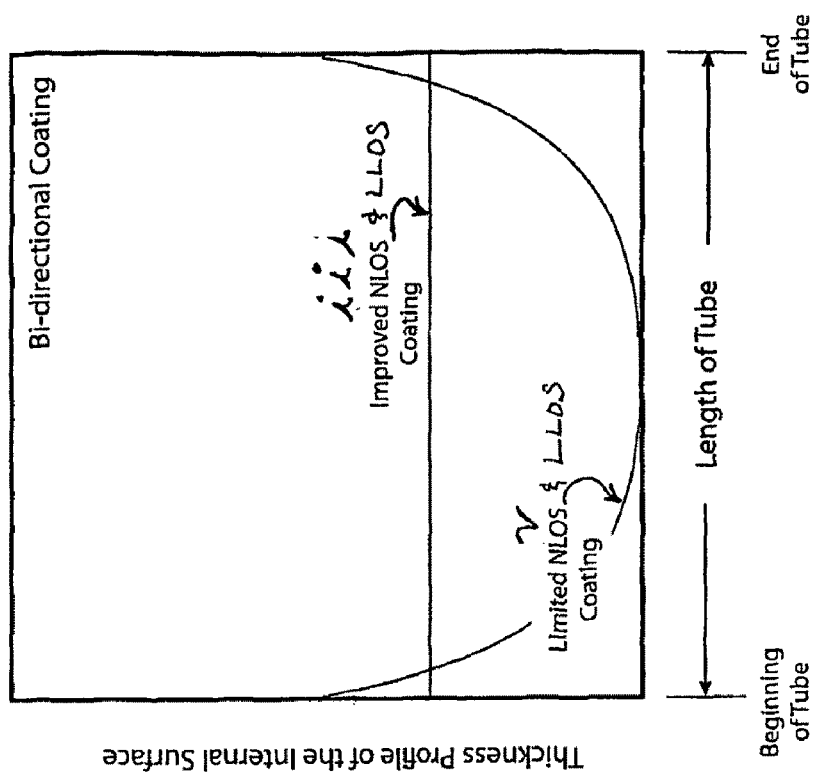
FIGS. 12 and 13 are graphical representations of the thickness profile of the internal surface of a tube versus the length of the tube for the uni-directional coating and bi-directional coating methods, respectively.
Figure 12:
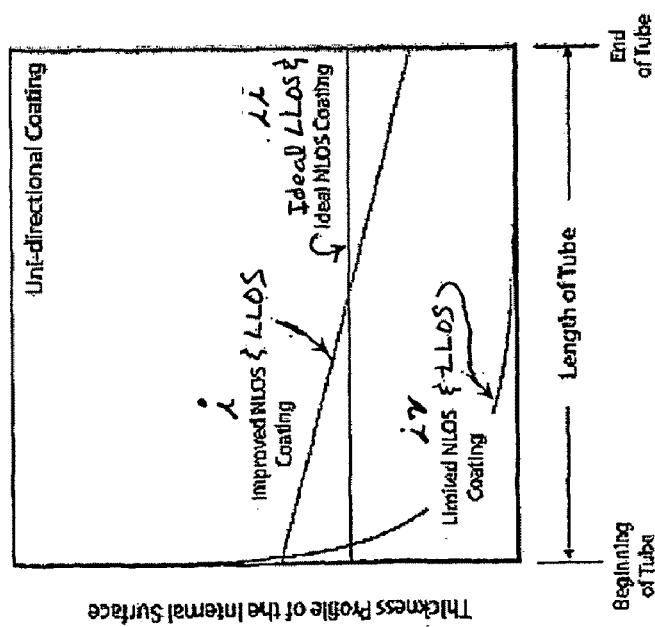

FIGS. 12 and 13 are graphical representations of the thickness profile of the internal surface of a tube versus the length of the tube for the unidirectional coating and bi-directional coating methods, respectively. FIGS. 12 and 13 illustrate that coating with non uniform thickness down the length of the tube can be improved through the use of bi-directional coating. Process conditions that result in a gradual thickness gradient from the entrance of the gas/vapor flux to the exit would benefit from, for example, reversing the entrance and exit (by rotating the tube about 180°) during the deposition process. For instance, an exemplary embodiment of the present invention DVD process conditions used during deposition results in a gradual (linear) thickness gradient (see line designated as "i") from the entrance of the gas/vapor flux to the exit, as shown in FIG. 12, and therefore would benefit from reversing the entrance and exit (by rotating the tube about 180°) half way into the deposition process, as shown as line "iii" in FIG. 13. The coating thickness at the mid-point of the tube after the first half of the deposition process is required to be at least 0.5× the thickness of the tube entrance for a uniform coating to result. However, if the thickness of coating changes in a non-linear manner along the length of the tube (see line designated as "iv"), as shown in FIG. 12, rotating the tube 180° will not improve the thickness uniformity, as shown as line "v" in FIG. 13.

Figure 14A:
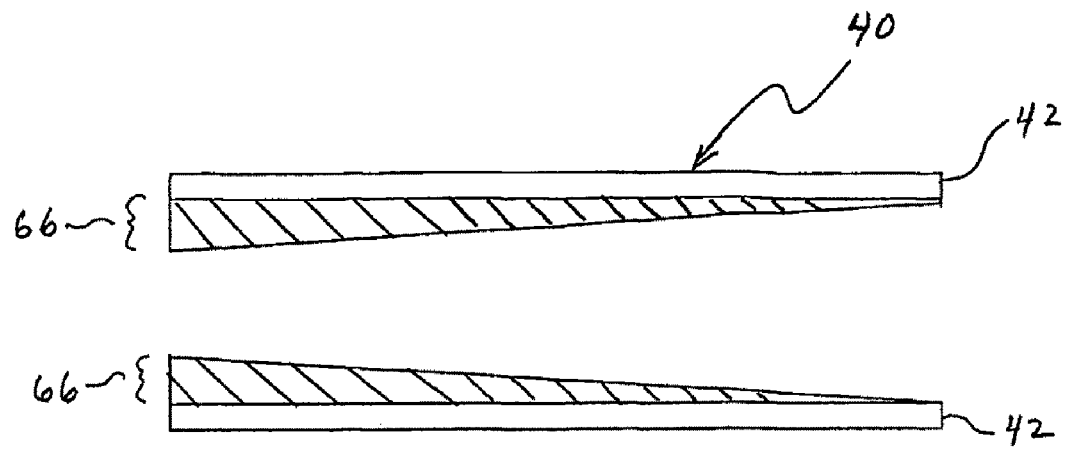
FIGS. 14(A)-(B) are schematic depictions of a segment of a tube that is coated during an embodiment of the present invention deposition process.
Figure 14B:
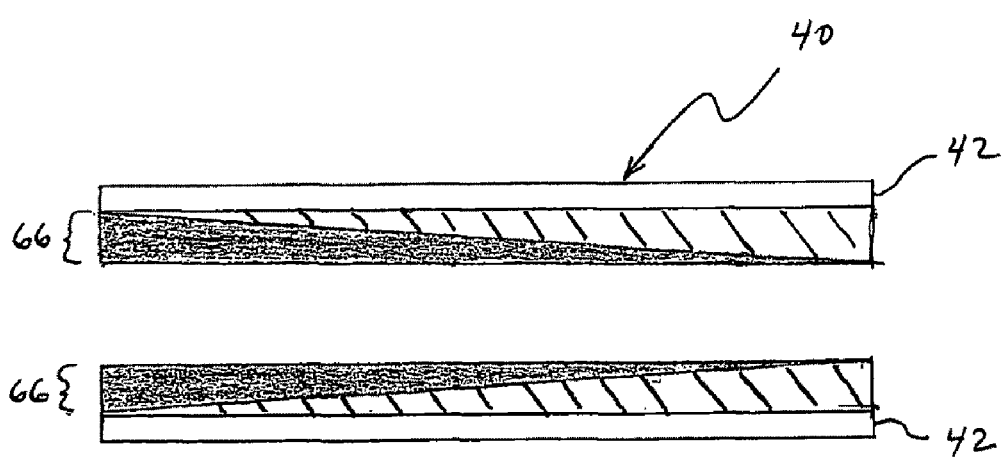

Turning to FIGS. 14(A)-(B), FIGS. 14(A)-(B) are schematic depictions of a segment of a tube 40 that is coated during the an embodiment of the present invention deposition process wherein a gradual linear coating 66 is provided on the walls 42. As shown in FIG. 14(A), the first pass coating 66 deposited on the walls 42 is represented by the hash marks. The tube is then flipped 180° and the second pass of the coating 66 is deposited on the walls 42 represented by the shaded region, as shown in FIG. 14(B).

Figure 15:
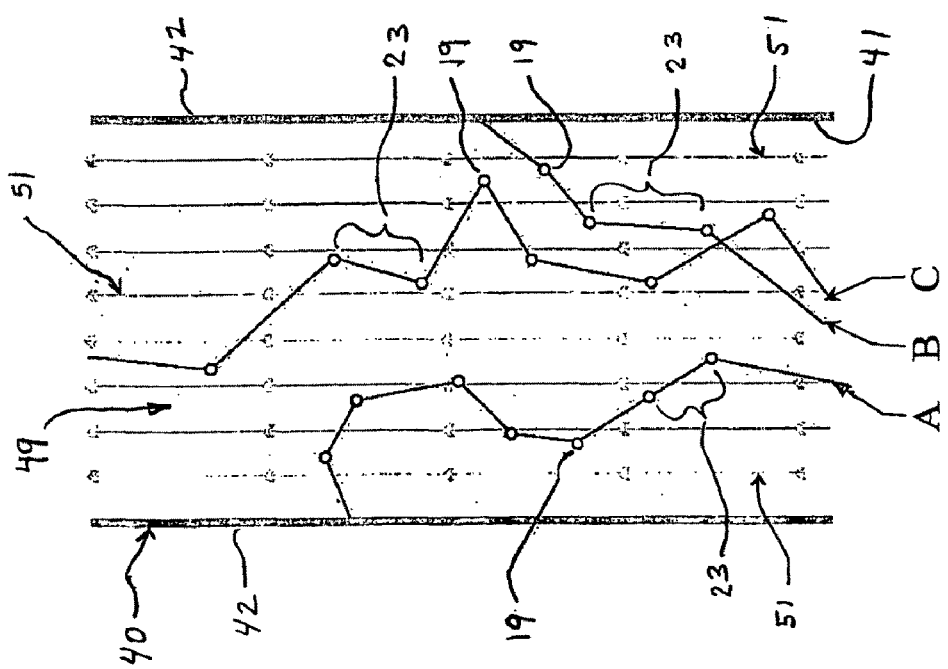
FIG. 15 is a schematic illustration showing an embodiment of the present invention process conditions in the interior cavity of the tube (or applicable type of component or substrate).

Turning to FIG. 15, FIG. 15 is a schematic illustration showing an embodiment of the present invention process conditions in the interior cavity 49 of the tube 40 (or applicable type of component or substrate) that are set to allow lateral diffusion within the jet and deposition onto the interior surfaces 41 of the tube (or desired component or substrate). The evaporant molecules (not shown) entrained within those stream lines 51 have a given flow velocity, vf. To allow the evaporated vapor flux to at least partially coat the NLOS and/or LLOS portions of the substrate walls 42, the flow velocity, vf, allows the scattering time interval, t, of the evaporant molecules and gas molecules to be less than the time the evaporant molecules are within the mean free path ($\lambda$) 23, of the vicinity or proximity of the NLOS and/or LLOS regions or vicinity/proximity of the wall 41 to be coated. The scattering time interval, t, being defined as the time between collisions of the evaporant molecules and the carrier gas molecules (such collisions of the carrier gas molecules and vapor atoms being schematically represented by reference number 19). The mean free path ($\lambda$) 23 is defined as the path segment between successive collisions between a carrier gas molecule and an evaporant molecule; such collisions are as shown by reference numbers 19.

Figure 16:
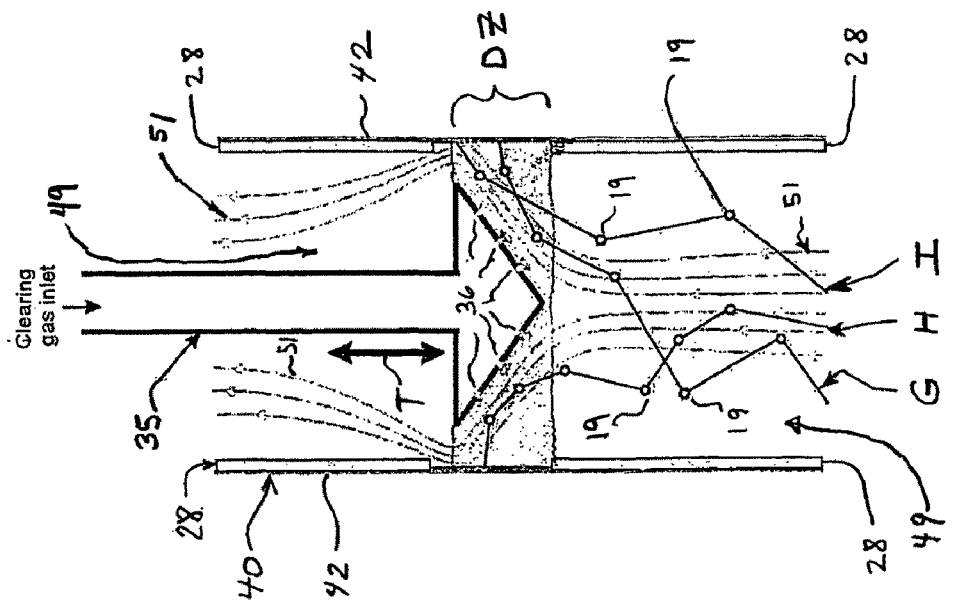
FIG. 16 is a schematic illustration showing an embodiment of the present invention comprising the use of a vertically translating deflector.

Turning to FIG. 16, FIG. 16 is a schematic illustration showing an embodiment of the present invention comprising the use of a vertically translating deflector 35 that alters the streamlines 51 of the carrier gas jet and that promotes the deposition of vapor atoms diffusion paths G, H, and I having a near normal angle of incidence in a deposition zone DZ near the vertical position of the deflector 35. The deflector 35 may be a plate, cone, sphere, ellipsoid or any geometrical shaped object that is shaped to deflect or alter the flow of the streamlines 51. This deflector 35 could include, for example, a cone shaped deflector with small exit points for an argon clearing gas 36. The deflector 35 would favorably alter the carrier gas trajectories to promote vapor atom deposition in a deposition zone DZ. By translating the deflector vertically, for example as shown by the arrow designated as T, the thickness uniformity could be precisely engineered. The argon clearing gas 36 (or any suitable or desired clearing gas) would be used to prevent deposition onto the deflector plate and thus improve the process efficiency. It should be appreciated that any inert gas could be used (e.g., He, Kr, Ne, etc.) and in some cases a reactive gas such as $O_2$, $N_2$, $H_2$, $CH_4$, $NH_4$. A translatable screen or mask 28 would be used to prevent deposition outside of the deposition zone DZ. The translatable screen or mask 28 could be a telescoping design or be made of a flexible material so that the mask 28 would not interfere with the evaporation processes occurring at the source. The screen or mask 28 may be any one of a variety of designs suitable for blocking or hindering the vapor deposition onto the component or regions thereof.

Figure 17:
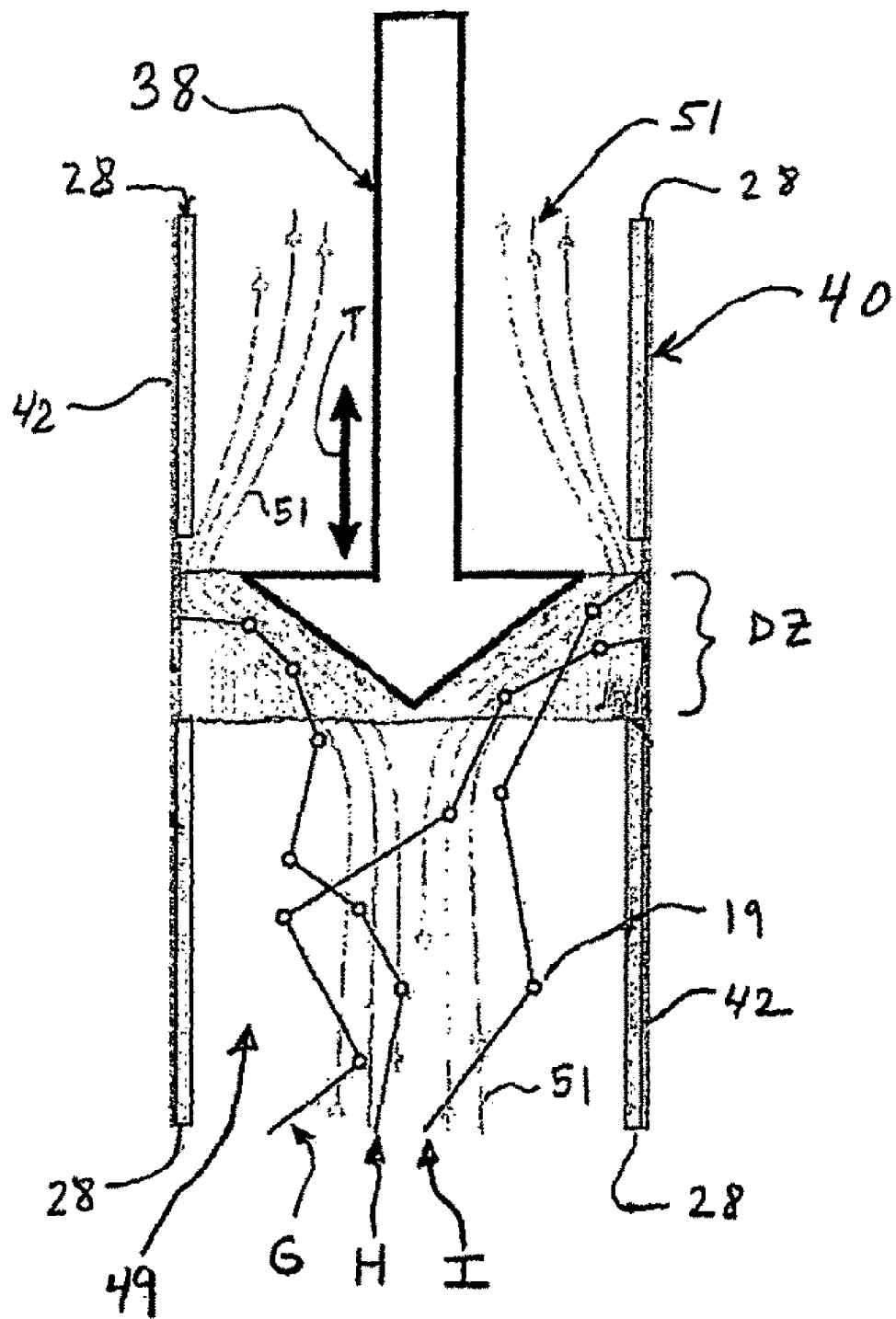
FIG. 17 is a schematic illustration showing an embodiment of the present invention comprising the use of secondary jets.

Turning to FIG. 17, FIG. 17 is a schematic illustration showing an embodiment of the present invention comprising the use of secondary jets 37, such as pulsed secondary jets, moving in the opposite direction of the vapor flux or at any directional angle as required to achieve the deflection or alteration of the stream line 51. In this case, the "gas deflector" is not a solid object but a secondary gas jet moving in the opposite direction of the primary gas jet. By pulsing the secondary gas jet (or both the primary and secondary gas jets) and controlling its relative density and velocity the location of the deposition zone DZ can be altered and the coating thickness controlled.

Figures 18A, 18B:
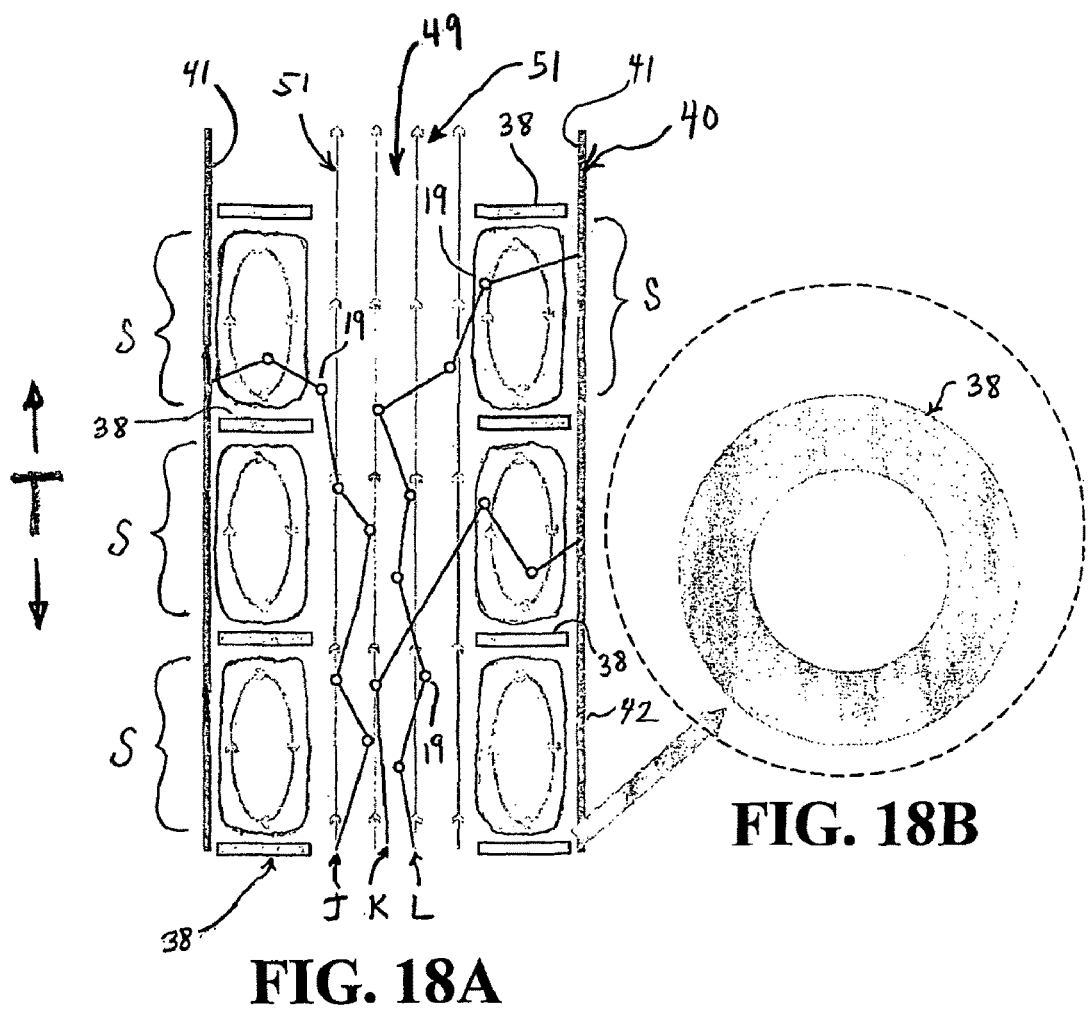
FIG. 18(A) is a schematic illustration showing a partial segment of a tube (component) wall with the use a numerous ring shaped baffles.
FIG. 18(B) is a schematic top view of an exemplary ring baffle shown in FIG. 18(A).

Turning to FIGS. 18-19, FIGS. 18-19 is a schematic illustration showing a partial segment of the tube wall 42 (or applicable structure, substrate or component) wherein an embodiment of the present invention includes the use of baffles near the tube walls 42 which locally reduce the gas jet velocity and alter the flow field of the gas jet. The "baffles" can be rings 38 or a spiral strip 39 that reduce the gas jet velocity near the component walls 42 and promote non-line-of-sight and limited-line-of-sight deposition. The baffles can be a variety of geometrical shapes with design criteria sufficient to reduce the gas jet velocity or alter the flow field of the gas jet. The position of the baffles may be altered during the deposition process by vertically translating the rings 38 and spiral strip 39, for example as shown by the arrow referenced as T, or by rotating the baffles. This will alter the deposition thickness profile along the component walls. Referring to FIG. 18(A), FIG. 18(A) is a schematic illustration showing the use a numerous ring shaped baffles 38 to create stagnant flow regions, designated as "S" near the surface to be coated. These stagnant flow regions S promote the lateral diffusion of vapor atoms onto the interior surface 41 of the walls 42. These stagnant flow regions S also define the deposition zone of the wall 42. The streamlines 51 of the carrier gas jet are illustrated as well as the deposition of vapor atoms diffusion paths J, K, L having a near normal angle of incidence for deposition onto the walls 42. The spacing and dimensions of the ring can be varied to altering the flow conditions as desired. FIG. 18(B) is a schematic top view of an exemplary ring baffle 38 shown in FIG. 18(A).

Figures 19A, 19B:
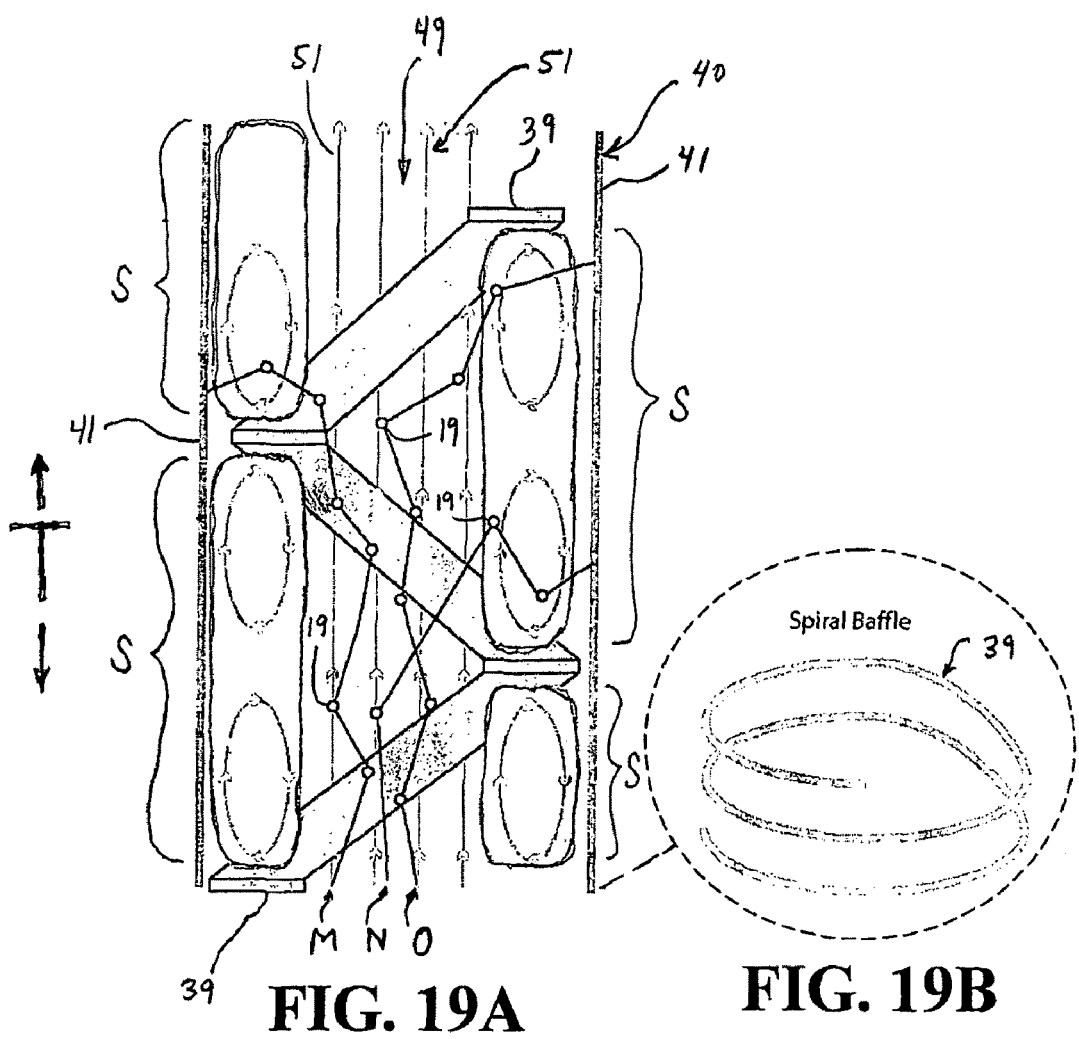
FIG. 19(A) is a schematic illustration showing a partial segment of a tube (or applicable component) wall with the use a numerous spiral shaped baffles.
FIG. 19(B) is a schematic top view of an exemplary spiral baffle shown in FIG. 19(A).

Referring to FIG. 19, FIG. 19 is a schematic illustration showing the use a spiral shaped baffles 39 to create stagnant flow regions S near the surface to be coated on the walls 42. These stagnant flow regions S promote the lateral diffusion of vapor atoms onto the interior surface 41 of the walls 42. These stagnant flow regions S also define the deposition zone of the wall 42. The streamlines 51 of the carrier gas jet are illustrated as well as the deposition of vapor atoms diffusion paths M, N, O having a near normal angle of incidence for deposition onto the walls 42. The spacing and dimensions of the spiral baffle 39 can be varied to altering the flow conditions as desired. The baffle (or the component) may also be rotated during deposition to continuously alter the flow conditions. FIG. 19(B) is a schematic top view of an exemplary spiral baffle 39 shown in FIG. 19(A). It should be appreciated that the spiral is shown in a compressed position for drawing illustration purposes.

Figure 21:
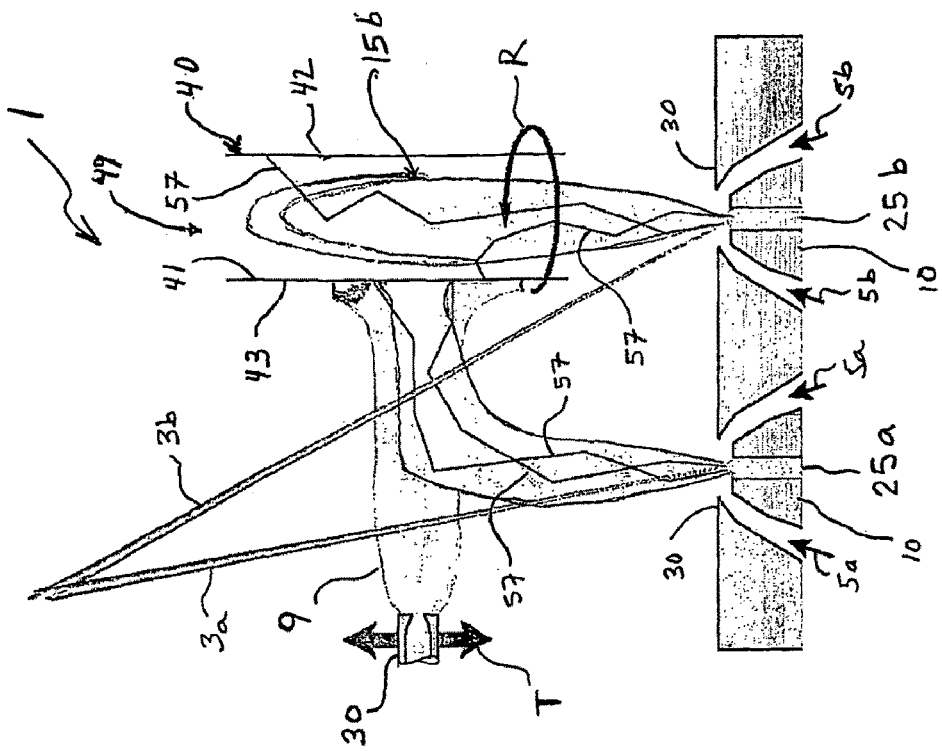
FIGS. 20-21 are schematic illustrations showing a partial segment of the tube wall (or applicable component) wherein an embodiment of the present invention includes a deposition approach that allows not only the deposition of effective coatings onto the interior surfaces of components, but also the simultaneous deposition onto exterior surfaces well (or sequential deposition if desired).
Figure 20:
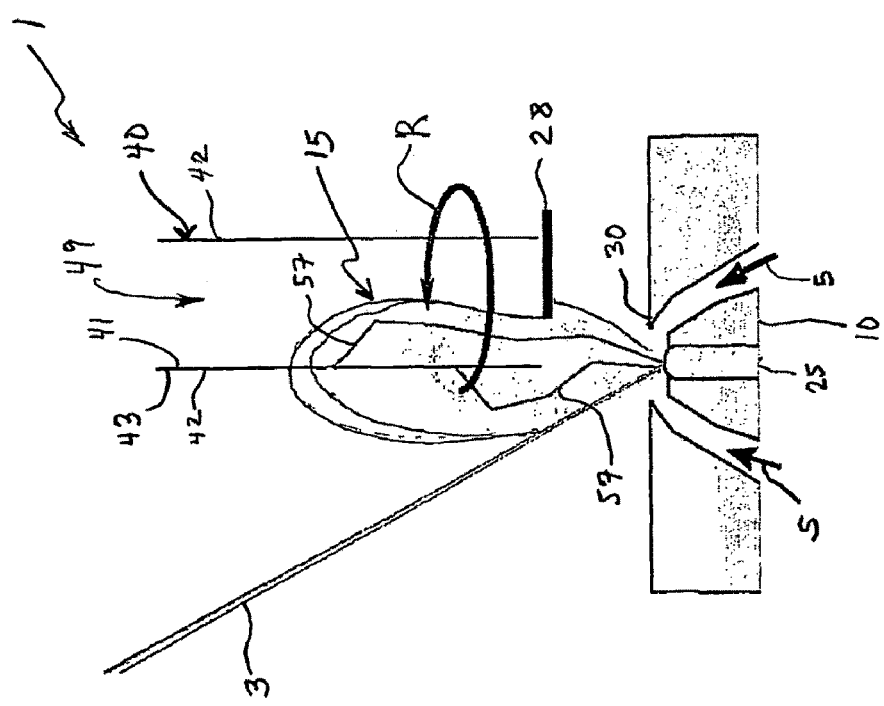

Turning to FIGS. 20-21, FIGS. 20-21 are schematic illustrations showing a partial segment of the tube wall 42 wherein an embodiment of the present invention includes a deposition approach that allows not only the deposition of effective coatings onto the interior surfaces 41 of components 40, but in many cases the simultaneous deposition onto exterior surfaces 43 well. FIGS. 20-21 illustrate the simultaneous deposition of a coating material onto the interior surface 41 and exterior surface 43 of a tube 40 or the like using a single source configuration and a dual-source configuration, respectively. The vapor atom trajectories 57 deposit onto the interior surface 41 and exterior surface 43. Processes do currently exist to apply coatings onto the external regions (i.e. HVOF (wear), IVD (corrosion)); however, the use of two separate processes is not only costly but also inefficient Thus, the various embodiments of the present invention processing approaches that allow the simultaneous deposition of the desired coating onto both the interior and exterior regions 41, 43 are highly desirable.

The flexibility to control the vapor transport during deposition the various embodiments of the present invention DVD process enables several approaches for achieving this. For instance, referring to FIG. 20, a tube 40 (or suitable component, structure, or substrate) is placed with one tube wall 42 (or any type of wall or region of a suitable component, structure, or substrate) directly above the evaporant source 25 while the tube 40 is rotated, as illustrated by the arrow designated R, to obtain circumferential uniformity (or partial circumferential uniformity or regional uniformity if the tube is only partially rotated or moved). This approach is appealing as it would deposit a similar coating thickness distribution on both the interior 41 and exterior 43 of the tube 42 in a single step. Further, the deposition process of coating vertically aligned walls or plates of the various embodiments of the present invention indicates that while a thicker coating is obtained on the part of the component located nearest the vapor source the thickness only decreases gradually and when coating parts (such as a tube, wall or region) where the entrance and exit can be reversed (by rotating the tube 180°) during the deposition process, a very uniform coating thickness can be simultaneously obtained on the tube exterior surface 41 and interior surface 43.

Turning to FIG. 21 is a schematic illustration showing a partial segment of the tube wall 42 (or any type of component wall or region) wherein an embodiment of the present invention includes a dual-source configuration, 25a and 25b. In this exemplary embodiment, the extremely high scanning rate (approximately 100 kHz, for example) of the DVD e-beam gun can be used to co-evaporate the desired composition from both sources, 25a and 25b. A vertical gas jet 5b (i.e., primary carrier gas jet) is used to focus the vapor 15b from the first source 25b into the interior cavity 49 of the component 40 while a horizontal gas jet 9 (i.e., secondary carrier gas jet) is used to deposit material from the second source 25a. The coating thickness uniformity is controlled on the interior surface 41 of the tube 40 (or applicable component, structure or substrate) by altering the vertical gas jet conditions, and on the exterior surface 43 by translating the horizontal gas jet up and down. The tube 40 may be rotated, as illustrated by the arrow designated R. The end result is again a uniformly coated part on the exterior surface 43 and interior surface 41. Moreover, this concept (or variation of it) would also enable different coating compositions to be simultaneously deposited on the component exterior and interior. It should be appreciated that sources, 25a and 25b may be of similar or dissimilar materials. Moreover, it should be appreciated that either or both source 25a and source 25b may be switched with different materials such as by rotating, moving or substituting the crucible 10.

Next, some components require coatings to have different attributes at different internal locations/regions. For example, but not limited thereto, in landing gear applications, some locations experience significant wear and thus, require hard, well adhered coatings to limit damage. Such coatings should also have adequate corrosion resistance. In other locations/regions only corrosion protection is required. While having one coating composition optimized for the elimination of all modes of damage is most desirable it is more likely that the coating composition having the best wear performance will be different than the coating composition giving the best corrosion protection. This situation can be difficult from a processing standpoint since conventional processing techniques would require multiple processes/processing steps (e.g., deposition/masking/grinding) to obtain the desired coating at the desired locations. The conventional approach, at best, adds cost to the deposition of the coatings and in some cases limits the ability to deposit the desired coating composition.

Figures 22A, 22B, 22C:
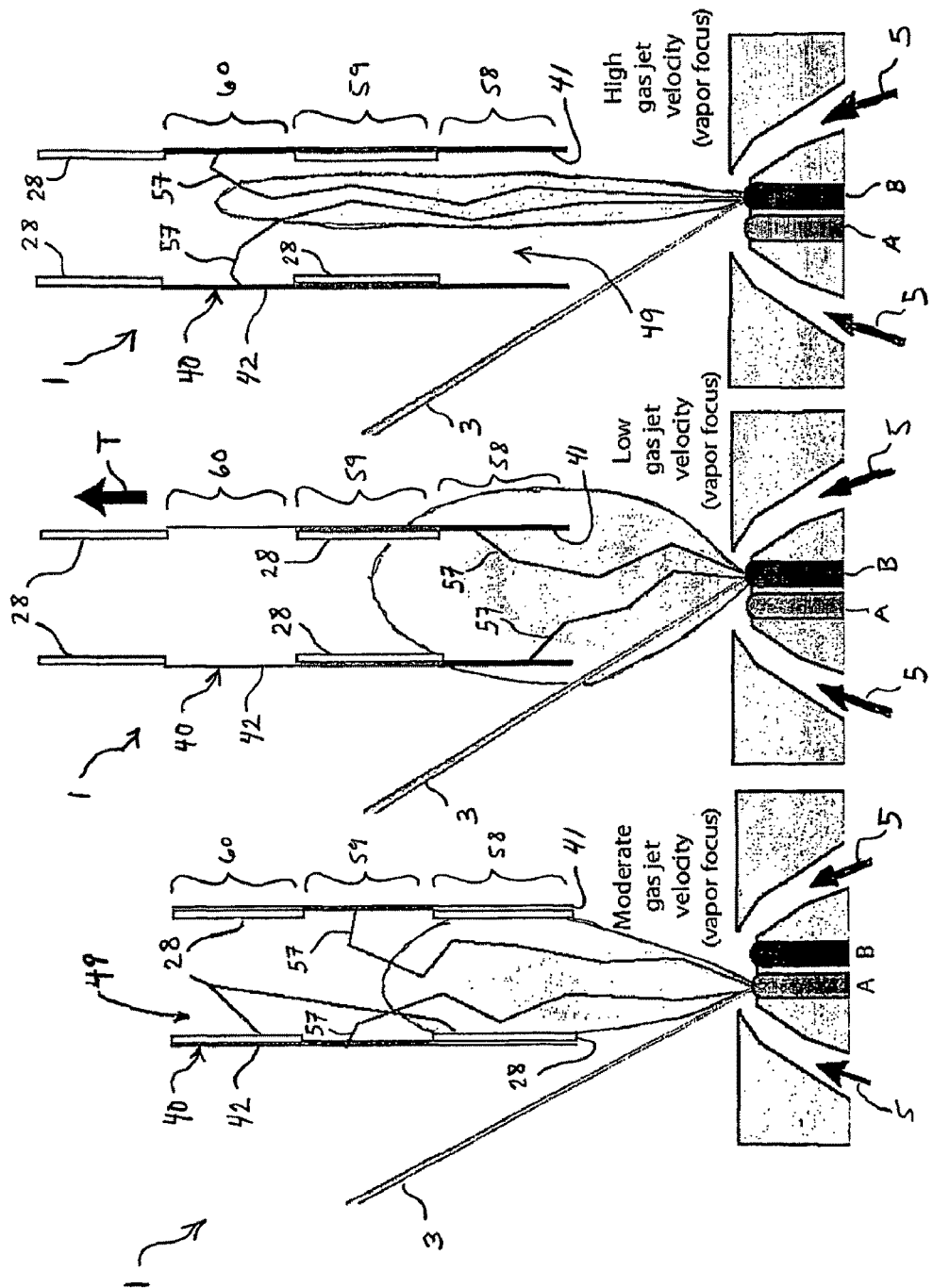
FIGS. 22(A)-(C) schematically illustrate exemplary embodiments of the present invention deposition apparatus (partial view) in operation utilizing a mask technique and/or altering process parameters for coating various regions or substrates.

Accordingly, the multi-source evaporation capabilities of the various embodiments of the present invention DVD process results in the ability to quickly alter the vapor composition during deposition. This coupled with the ability to control where the vapor deposits on the substrate by controlling the trajectories of the vapor atoms as well as the use of masking approaches makes the deposition of different coating compositions onto different regions/locations of the substrate/component possible in a single deposition step. For example, with regards to the exemplary embodiment shown in FIGS. 22(A)-(C), coating of material A is to be deposited on the middle section/region of the tube interior surface 41 and a coating of material B is to be deposited on the sections near or toward the tube entrance (proximal region) and exit (distal region) of the interior surface 41. Accordingly, it is feasible to deposit different coating compositions onto different internal regions/locations of a substrate or component (tube for example) in a single deposition run. The initial set-up is shown in step 1 (FIG. 22(A)) where a mask 28 is used to shield the proximal and distal sections/regions 58, 60 from coating while leaving the middle section/region 59 exposed to define a deposition zone. The electron beam is scanned across source A to create a vapor flux and a moderate carrier gas flow rate is used. The gas flow rate is chosen to allow most of the atom impacts to occur in the unmasked region 59. Coating of the mask will occur to some extent, but this is wasted material and should be limited. After the desired coating thickness is achieved in the middle (intermediate) region 59, the mask 28 is translated upward to mask the middle region 59 and expose the outer regions (proximal section/region 58 and distal section/region 60) as shown in FIGS. 22(B)-(C)). The electron beam 3 is adjusted to allow evaporation of only source B and coatings with this material begins. The gas jet will initially be set at a high value to facilitate coating growth near the tube exit (distal section/region 60) as shown in FIG. 22(B) to define a deposition zone and then be altered to a low level to facilitate coating near the tube entrance (proximal section/region 58) as shown in FIG. 22(C)) to define a deposition zone. The final result is a coating having composition A in the middle and composition B on the outer regions (distal section/region 60 and proximal section/region 58). It should be appreciated that the sequence of the steps may be altered as well as omitting subject steps or adding additional steps. It should be appreciated that one or more sections/regions may be implemented as desired or required and any given section/region may have a varying lengths as required or desired.

Next, referring to FIGS. 23(A)-(C), there is provided an embodiment of the present invention DVD process that results in the ability to quickly alter the vapor composition during deposition of the coating. This coupled with the ability to control where the vapor deposits on the substrate/component (or regions or sections thereof) by controlling the trajectories of the vapor atoms as well as the use of masking approaches makes the deposition of different or same coating compositions onto different regions of the substrate possible in a single deposition step. For example, with regards to the exemplary embodiment shown in FIGS. 22(A)-(C), coating of material 25 is to be deposited on the middle (intermediate) section/region 59 of the tube interior surface 41 as well as to be deposited on the proximal section/region 58 toward the tube entrance and on the distal region/section 60 toward the tube exit. Accordingly, it is feasible to deposit different coating compositions or same compositions onto different internal regions of a substrate or component (tube for example) in a single deposition run. The initial set-up is shown in step 1 (FIG. 23(A)) where a mask 28 is used to shield the proximal and distal sections/regions 58, 60 from coating while leaving the middle section/region 59 exposed to define the deposition zones. The electron beam is scanned across the evaporant source 25 to create a vapor flux and a moderate carrier gas flow rate is used. The gas flow rate is chosen to allow most of the atom impacts to occur in the unmasked region. Coating of the mask will occur to some extent, but this is wasted material and should be limited. After the desired coating thickness is achieved in the middle (intermediate) region 59, the mask 28 is translated upward to mask the middle region/section 59 and expose the outer regions (proximal region/section 58 and distal region/section 60) as shown in FIGS. 22(B)-(C)) to define the deposition zones. The electron beam 3 is adjusted to allow evaporation of only evaporant source 25 and coatings with this material begins. Evaporant source 25 may remain the same material or be switched with other material types.

The gas jet will initially be set at a high value to facilitate coating growth near the tube exit (distal region/section 60) as shown in FIG. 22(B) to define the deposition zone and then be altered to a low level to facilitate coating near the tube entrance (proximal region/section 58) as shown in FIG. 22(C)) to define the deposition zone. The final result is a coating having a composition of the chosen evaporant source(s) 25 in the middle (intermediate) region/section 59 and the outer regions (distal region/section 60 and proximal region/section 58). It should be appreciated that the sequence of the steps may be altered as well as omitting subject steps or adding additional steps. It should be appreciated that one or more sections/regions may be implemented as required or desired and any given section/region may have varying lengths as required or desired.

Figure 24:
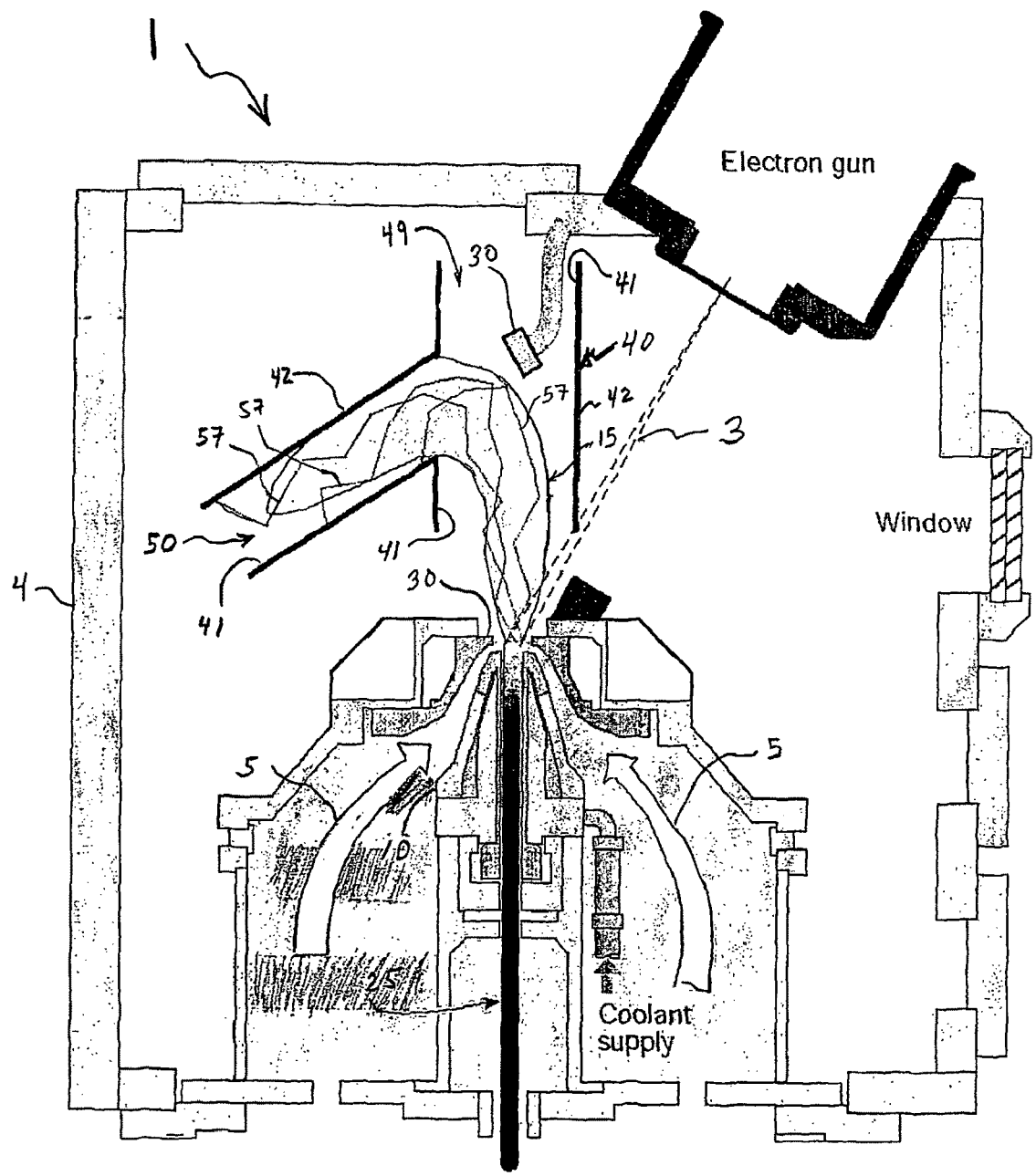
FIG. 24 is a schematic illustration of an embodiment of the present invention DVD apparatus used to coat a material into the secondary interior cavities, but is applicable to any primary cavities as well.

Next, the internal regions of a "Z", "U", "J", "Y", "T" or "L" shaped component can also be coated using the combination of primary and secondary gas jets as shown in FIG. 24. FIG. 24 is a schematic illustration of an embodiment of the present invention DVD apparatus used to coat a material into the secondary interior cavities 50 of a "Z", "U", "J", "Y", "T" or "L" shaped component 40 or any other desired irregular or challenging configuration. In this exemplary embodiment, the secondary jet 37 produced from a secondary nozzle 30, such as a translatable gas nozzle, is used to deflect the vapor atoms into internal cavity 50 of the component 40 that are not otherwise effectively infiltrated by the primary jet 5. The secondary gas jet 37 can be pulsed, can be tilted, can be horizontally and vertically translated and rotated to enable the deflection of the primary jet 5 in any direction and at any coordinate inside the chamber 4. The upstream pressure, pressure ratio and carrier gas type can all be altered during the coating run to control the position of the deposition zone along the internal surface 41 of the secondary interior cavity 50 of the component 40, such as in the "Z", "U", "J", "Y", "T" or "L" portions/sections of the component 40.

It should be appreciated that instead of or in addition to the secondary nozzle 30, baffles or deflectors as previously discussed herein may be utilized to deflect or alter the vapor atoms, such as to deflect the vapor atoms into the "Z", "U", "J", "Y", "T" or "L" portions/sections of the component 40. It should be appreciated that the "Z", "U", "J", "Y", "T" or "L" portions/sections may also be any variety of shape branches or shape of cavity space.

It should be appreciated that any processes discussed in this document regarding the secondary interior cavity 50 and primary interior cavity 49 are interchangeable with one another or may be substituted with the other. For example, any secondary jets may be used for the interior cavity 49 having any open shape or space.

Figure 25B:
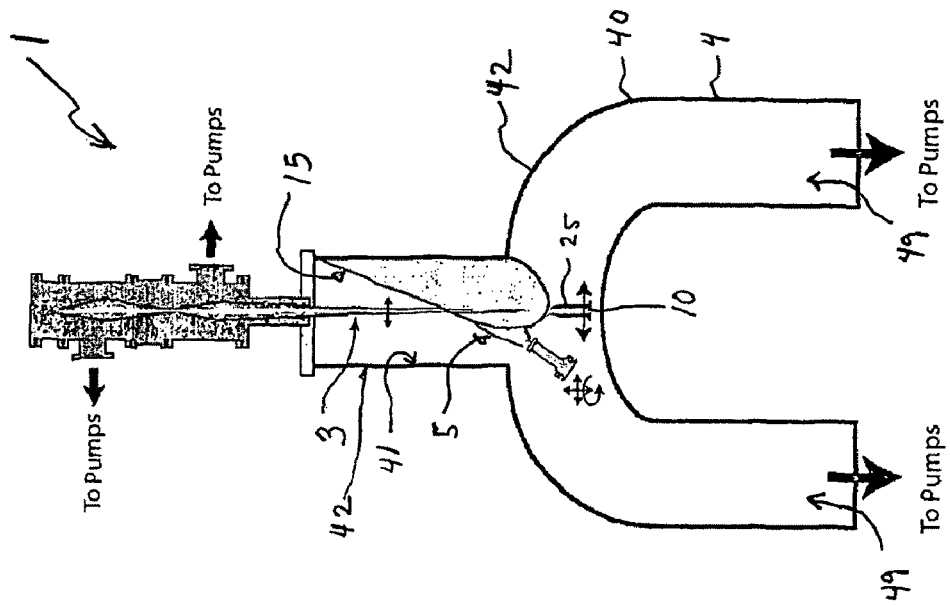
FIGS. 25(A)-(B) are schematic illustrations showing directed vapor deposition method and apparatus embodiments of the present invention used to coat the interior surface of a very large component, for example, wherein the component (tube, substrate, housing or structure) may functions as the chamber as well.
Figure 25A:
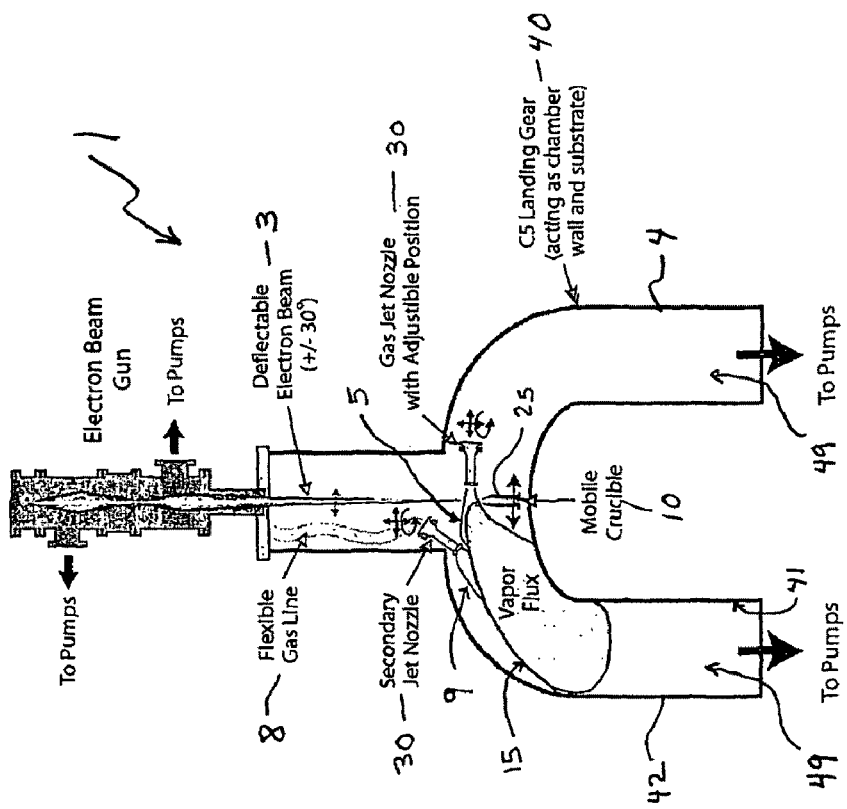

FIGS. 25(A)-(B) are schematic illustrations showing directed vapor deposition method and apparatus embodiments of the present invention used to coat the interior surface 41 of a very large component 40, for example. In these exemplary embodiments, the component 40 acts as both the vacuum chamber 4 and the substrate/component 40. By placing a mobile crucible in a central region of the component the vapor flux can be directed onto the interior surfaces 41 (or regions/sections thereof) of the entire component with the use of multiple gas jet nozzles. FIG. 25(A) depicts primary and secondary gas nozzles 30. Although it should be appreciate that one or more than one gas nozzle may be implemented. With regards to the directed vapor deposition method and apparatus of FIG. 25(B), the nozzle placement is altered (compared to the embodiment shown in FIG. 25(A)) to change the region of the substrate that is coated, i.e., define the deposition zone.

Still referring to FIGS. 25(A)-(B), in order to coat the internal surfaces 41 of a very large component 40 an advanced electron beam gun or the like may be utilized to evaporate material from an internal crucible and multiple gas jet nozzles having adjustable positions and orientations to direct vapor atoms onto all or select interior surfaces 41 (or regions/sections thereof) of this component 40 may be utilized. The crucible 10 in this case can be moved and is placed into different interior locations of the component 40. The component 40 may (but is not required to) act as the walls 42 of the vacuum chamber. An electron beam gun is attached to one end of the component and vacuum pumps to any other ends. During operation the electron beam 3 is transmitted into the interior cavity 49 of the component 40 and impinges on a source rod 25 contained in the water-cooled crucible 10.

In a specific exemplary and non-limiting embodiment, an application to consider the component is a C5 landing gear, wherein the shape and size may be, for example and not limited thereto, for each "leg" about 3 feet long with the tubular shape having approximately a 1 ft. diameter. In addition, it should be appreciated that the present invention would be applicable to wide variety of dimensions/sizes and geometrical shapes/contours, as well as equipment and machinery types and applications.

Figure 26:
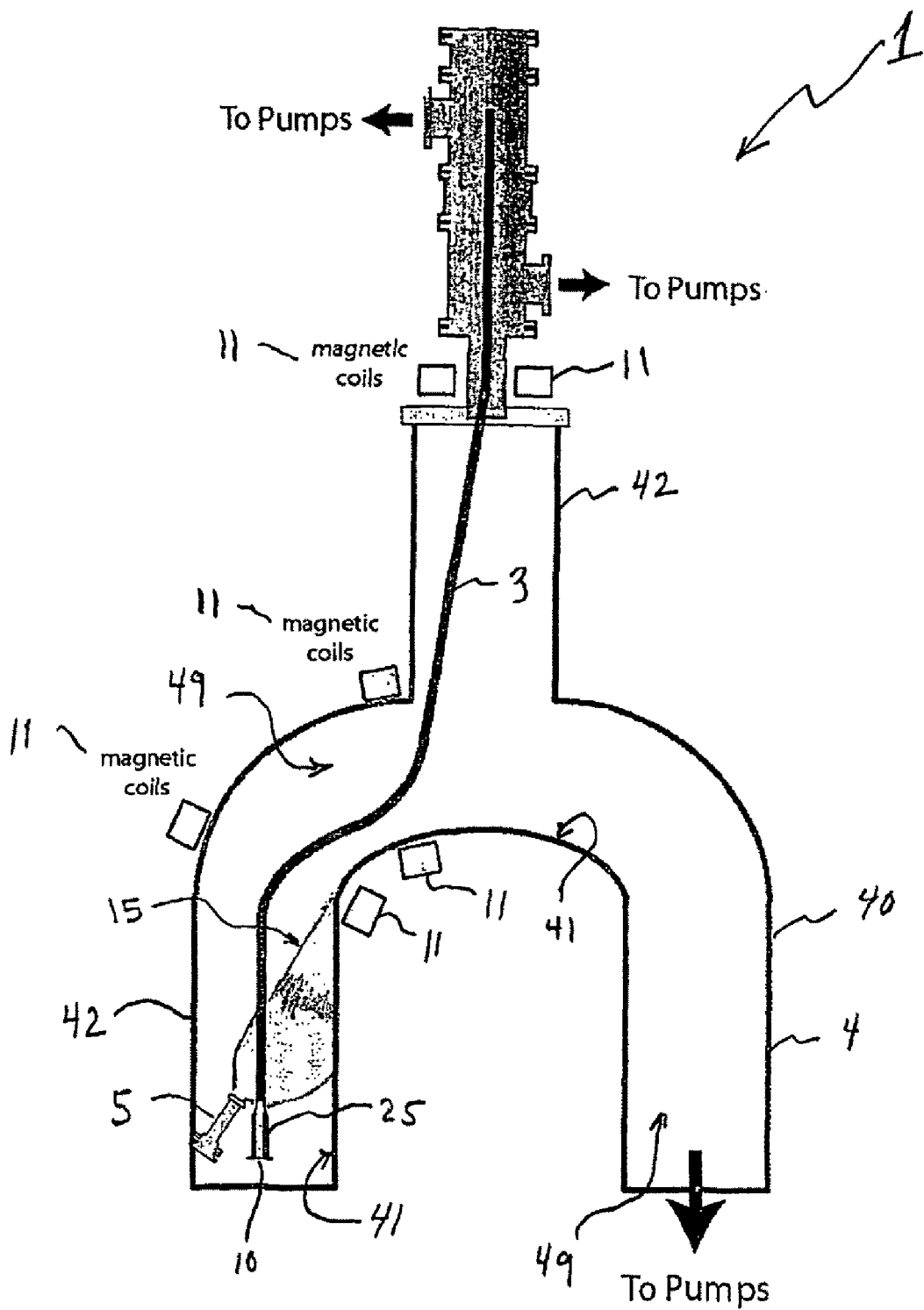
FIG. 26 is a schematic illustration showing directed vapor deposition method and apparatus embodiment of the present invention used to coat the interior surface wherein, the beam position can be manipulated using magnetic fields, electromagnetic fields, or permanent magnets to allow the crucible to be moved to different positions inside the component.

Turning to FIG. 26, FIG. 26 is a schematic illustration showing directed vapor deposition method and apparatus embodiment of the present invention used to coat the interior surface 41 of a very large component 40, for example. The beam position can be manipulated using magnetic fields to allow the crucible 10 to be moved to different positions inside the component 40. The resulting vapor flux 15 is then directed onto the walls 42 of the chamber through the use a gas jets 5 having a controllable position. The result is the ability to coat any one region or all regions of the interior surface 41 of the part/region/section of the walls 42, i.e., define the deposition zone. In an embodiment, magnetic fields (created using magnetic devices 11 such as coils of a wire (copper) with a current passing through them) or the like may be utilized to manipulate the path of an electron beam 3 through the component 40 and on to a crucible 4 where evaporation takes place. Various other methods of creating magnetic fields or electromagnetic fields could be utilized, such as for example, permanent magnets could be used in some cases.

Still referring to FIGS. 25-26, it should be appreciated that instead of or in addition to the primary or secondary nozzles 30 (or any number of plurality of nozzles), baffles or deflectors as previously discussed herein may be utilized to deflect or alter the vapor atoms, such as to deflect the vapor atoms into the various regions/sections or appendages of the component 40.

According to the design criteria discussed throughout, some illustrative examples of deposition systems and methods that may be implemented with some embodiments of the present invention are provided in the following applications and patents and are co-assigned to the present assignee 1) U.S. Pat. No. 5,534,314, filed Aug. 31, 1994, entitled "Directed Vapor Deposition of Electron Beam Evaporant," 2) U.S. Pat. No. 5,736,073, filed Jul. 8, 1996, entitled "Production of Nanometer Particles by Directed Vapor Deposition of Electron Beam Evaporant," 3) U.S. Pat No. 6,478,931 B1, filed Aug. 7, 2000, entitled "Apparatus and Method for Intralayer Modulation of the Material Deposition and Assist Beam and the Multilayer Structure Produced There from," and corresponding Divisional U.S. application Ser. No. 10/246,018, filed Sep. 18, 2002, 4) International Application No. PCT/US01/16693, filed May 23, 2001 entitled "A Process and Apparatus for Plasma Activated Deposition in a Vacuum," and corresponding U.S. application Ser. No. 10/297,347, filed Nov. 11, 2002, 5) International Application No. PCT/US02/13639, filed Apr. 30, 2002, and corresponding U.S. application Ser. No. 10/476,309, filed Oct. 29, 2003 entitled "Method and Apparatus for Efficient Application of Substrate Coating," 6) International Application No. PCT/US2003/037485, filed Nov. 21, 2003 entitled "Bond Coat for a Thermal Barrier Coating System and Related Method thereof," 7) International Application No. PCT/US2003/036035, filed Nov. 12, 2003, entitled "Extremely Strain Tolerant Thermal Protection Coating and Related Method and Apparatus thereof," 8) International Application No. PCT/US03/12920, filed Apr. 25, 2003, entitled "Apparatus and Method for High Rate Uniform Coating, Including Non-line of Sight," and corresponding U.S. application Ser. No. 10/512,161, filed on Oct. 15, 2004, 9) International Application No. PCT/US2003/023111, filed Jul. 24, 2003, entitled "Method and Apparatus for Dispersion Strengthened Bondcoats for Thermal Barrier Coatings," 10) International Application No. PCT/US02/28654, filed Sep. 10, 2002 entitled "Method and Apparatus for Application of Metallic Alloy Coatings" and corresponding U.S. application Ser. No. 10/489,090, filed Mar. 9, 2004, entitled "Method and Apparatus for Application of Metallic Alloy Coatings;" and 11) International Application No. PCT/US04/24232, filed Jul. 28, 2004 entitled "Method for Application of a Thermal Barrier Coating and Resultant thereof" of which all of these patents and applications listed above are hereby incorporated by reference herein in their entirety.

According to the design criteria discussed throughout, various substrate designs (walls, components, regions, structures, longitudinal sections) of the present invention are possible. For example, as shown in co-pending and co-assigned PCT International Application No. PCT/US02/17942, entitled "Multifuctional Periodic Cellular Solids And The Method Of Making Thereof," filed on Jun. 6, 2002, of which is hereby incorporated by reference herein in its entirety, there is provided ways of forming the substrate as a core that is comprised of three-dimensional space filling layers having an array of out-of-plane truss units. The out-of-plane truss units may be a variety of shapes including tetrahedral, pyramidal, Kagome, combinations thereof and other non-limiting arrangements. The out-of-plane truss units have hollow or solid leg members, for example, but not limited thereto. The core may be affixed to face plates.

According to the design criteria discussed throughout, other substrate designs (walls, components, regions, structures, longitudinal sections) of the present invention are possible. As shown in co-pending and co-assigned PCT International Application No. PCT/US01/17363, entitled "Multifunctional Periodic Cellular Solids And The Method Of Making Thereof," filed on May 29, 2001, and corresponding U.S. application Ser. No. 10/296,728, filed Nov. 25, 2002, of which are hereby incorporated by reference herein in their entirety, there is provided ways of forming the substrate that includes a core that is comprised of textile layers with a center sheet disposed between adjacent, said textile layers, however, alternatively, the center sheet may be omitted. In addition to woven textile arrays, various suitable materials may be used. For example, some non-limiting examples are the following: woven, knitted, braided, triaxial, and biaxial, pre-crimped quasi-triaxial, 3-D braid textile, 3-D multi-ply weave, 3-D triaxial weave, 3-D multi-axial weave, 3-D 'H' or 'I' beam, 3-D honey-comb type configurations, respectively, that can be used in arrays. Finally, other textile type classifications may be implemented as discussed and as shown in PCT No. PCT/US01/17363 and corresponding U.S. application Ser. No. 10/296,728.

In addition, according to the design criteria discussed throughout, other substrate designs (walls, components, regions, structures, longitudinal sections) of the present invention are possible. As shown in co-pending and co-assigned PCT International Application No. PCT/US01/22266, entitled "Heat Exchange Foam," filed on Jul. 16, 2001, and corresponding U.S. application Ser. No. 10/333,004, filed Jan. 14, 2003, of which are hereby incorporated by reference herein in their entirety, there is provided other ways of forming the substrate coatings that includes a core that is comprised of an open cell having solid or hollow ligaments, foam, and/or interconnected network.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of the appended claims. For example, regardless of the content of any portion (e.g., title, section, abstract, drawing figure, etc.) of this application, unless clearly specified to the contrary, there is no requirement for any particular described or illustrated activity or element, any particular sequence of such activities, any particular size, speed, material, dimension, time period, or frequency, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Accordingly, the descriptions and drawings are to be regarded as illustrative in nature, and not as restrictive.

We claim:

1. A method for applying at least one coating on at least one substrate, said method comprising:
   presenting a stationary substrate to a chamber; said chamber having a downstream pressure, Pc, with an operating range from about $10^{-4}$ to about $10^3$ Torr;
   presenting at least one evaporant source to said chamber;
   presenting primary carrier gas streams comprised of gas molecules to said chamber;
   impinging at least one said evaporant source with at least one energetic beam in said chamber to generate an evaporated vapor flux comprised of evaporant molecules;
   said substrate having a distal end and a proximal end defining a longitudinal section therebetween, said substrate having an interior cavity; and
   said primary carrier gas streams deflecting at least a portion of said generated evaporated vapor flux by said primary carrier gas streams from an area distal from and external to said stationary substrate into said interior cavity of said substrate thereby coating at least a portion of interior of said longitudinal section.

2. The method of claim 1, further comprising:
   a first nozzle, wherein said primary carrier gas streams is generated from said first nozzle and said at least one evaporant source is disposed in said first nozzle.

3. The method of claim 1, further comprising:
   a first nozzle, wherein said primary carrier gas streams is generated from said first nozzle and said at least one evaporant source is disposed in proximity to said first nozzle.

4. The method of claim 1, wherein said evaporant molecules having a Knudsen number equal to or less than 1.

5. The method of claim 4, wherein
   said Knudsen number is defined by the ratio:
   mean free path, $\lambda$, / length of said at least portion of said coating.

6. The method of claim 1, wherein said energetic beam comprises at least one of electron beam source, laser source, heat source, ion bombardment source, highly focused incoherent light source, microwave, radio frequency, EMF, or any energetic beam that break chemical bonds, or any combination thereof.

7. The method of claim 1, wherein method of said coating is accomplished with a deposition method comprising:
   at least one of directed vapor deposition (DVD), evaporation (thermal, RF, laser, or electron beam), reactive evaporation, sputtering (DC, RF, microwave and/or magnetron), reactive sputtering, electron beam physical vapor deposition (EF-PVD), ion plasma deposition (IPD), low pressure plasma spray (LPPS), high velocity oxy-fuel (HVOF), vapor deposition, or cluster deposition.

8. The method of claim 1, wherein method of said coating is accomplished with a directed vapor deposition (DVD).

9. The method of claim 1, wherein said primary carrier gas streams comprise He, Ar, Ne, Kr, $O_2$, $N_2$, $NH_4$, $CH_4$, $H_2$, hydrocarbons, salines, and other inert gases, or combination of at least one of He, Ar, Ne, Kr, $O_2$, $N_2$, $NH_4$, $CH_4$, $H_2$, hydrocarbons, salines, and other inert gases.

10. The method of claim 1, wherein said at least one evaporant sources comprise a material comprising:
    at least one of metal, alloy, ceramic, semiconductor or polymer or any combination thereof.

11. The method of claim 1, wherein said substrate comprises a tube.

12. The method of claim 1, wherein said substrate comprises a shape comprising at least one of: casing, cylinder, drum, basket, receptacle, bin, box, collar, hamper, well, cell, cell-case, case, shell, hoop, cover, envelope, housing, enclosure, chamber, sleeve, holder, repository, shelter, body, or bowl.

13. The method of claim 1, wherein said substrate comprises a housing.

14. The method of claim 1, wherein said longitudinal section comprises one or more walls.

15. The method of claim 14, wherein said one or more walls comprise at least one recessed area, wherein said coating covers at least a portion of the area of said at least one recessed area.

16. The method of claim 15, wherein said at least one recessed area comprises a groove.

17. The method of claim 16, wherein said groove comprises at least one of the following: ridge, trench, channel, duct, trough, perforation, indentation, slot or concave area.

18. The method of claim 14, wherein said one or more walls comprise at least one recessed area, wherein said coating covers the entire area of said at least one recessed area.

19. The method of claim 14, wherein said evaporated flux at least partially coats said portion of said interior of said longitudinal section on a non-line-of-sight region relative to said evaporant sources.

20. The method of claim 14, wherein said evaporated flux at least partially coats said portion of said interior of said longitudinal section on a limited-line-of-sight region relative to said evaporant sources.

21. The method of claim 14, wherein said evaporated flux at least partially coats said portion of said interior of said longitudinal section on a limited-line-of-sight region and a non-line-of-sight region relative to said evaporant sources.

22. The method of claim 1, wherein said downstream pressure, Pc, having an operating range from about $10^{-3}$ to about $10^2$ Torr.

23. The method of claim 1, wherein said downstream pressure, Pc, having an operating range from about $10^{-2}$ to about 10 Torr.

24. The method of claim 1, wherein said downstream pressure, Pc, having an operating range from about 0.1 to about 1 Torr.

25. The method of claim 1, wherein said downstream pressure, Pc, having an operating range from about 0.05 to about 0.5 Torr.

26. The method of claim 1, wherein said downstream pressure, Pc, having an operating range from about 0.025 to about 0.3 Torr.

27. The method of claim 1, further comprises:
presenting a deflector member; and
said deflector member secondarily deflecting said at least a portion of said generated evaporated vapor flux that has been deflected into said interior cavity by said carrier gas streams thereby coating at least a portion of said longitudinal section, wherein said at least a portion of said longitudinal section defining a deposition zone.

28. The method of claim 27 wherein said deflector member comprises at least one of plate, sphere, cone, or ellipsoid, said plate, sphere, cone or ellipsoid at least partially disposed in said interior cavity of said substrate.

29. The method of claim 1, further comprises:
presenting a secondary carrier gas streams comprised of gas molecules in said interior cavity of said substrate, and
said secondary carrier gas streams secondarily deflecting said at least at least a portion of said generated evaporated vapor flux that has been deflected into said interior cavity by said carrier gas streams thereby coating at least a portion of said longitudinal section, wherein said at least a portion of said longitudinal section defining a deposition zone.

30. The method of claim 1, wherein said proximal end of said substrate initially being closer to said evaporant source relative to the distance of distal end to said evaporant source, said method further comprising:
moving said substrate wherein said distal end is closer to said evaporant source relative to the distance of said proximal end to said evaporant source.

31. The method of claim 30, wherein said moving said substrate comprises flipping said substrate approximately 180 degrees.

32. The method of claim 1, further comprises:
presenting a baffle member; and
said baffle member secondarily deflecting said at least a portion of said generated evaporated vapor flux that has been deflected into said interior cavity by said carrier gas streams thereby coating at least a portion of said longitudinal section, wherein said at least a portion of said longitudinal section defining a deposition zone.

33. The method of claim 32, wherein said baffle comprises a spiral member or ring member.

34. The method of claim 1, further comprises:
presenting a baffle member; and
said baffle member stagnating flow of said at least a portion of said generated evaporated vapor flux that has been deflected into said interior cavity by said carrier gas streams thereby coating at least a portion of said longitudinal section in proximity to said baffle.

35. The method of claim 34, wherein said baffle comprises a spiral member or ring member.

36. The method of claim 1, wherein said substrate comprising an exterior side on said longitudinal section substantially opposite from the interior cavity, said method further comprises:
said primary carrier gas streams deflecting at least a portion of at least one of said generated evaporated vapor flux by said primary carrier gas streams to the exterior of said substrate thereby coating at least a portion of exterior side of said longitudinal section.

37. The method of claim 36, wherein said longitudinal section comprises one or more walls.

38. The method of claim 36, wherein said evaporated flux at least partially coats said portion of said interior and exterior of said longitudinal section on a limited-line-of-sight region and a non-line-of-sight region relative to said evaporant source.

39. The method of claim 1, further comprising:
presenting a first nozzle;
presenting a second nozzle, wherein a second primary carrier gas streams is generated from said second nozzle and a second said evaporant source is disposed in said second nozzle;
impinging said second evaporant source with at least one electron energetic beam in said chamber to generate a second evaporated vapor flux comprised of evaporant molecules;
presenting a secondary carrier gas streams comprised of gas molecules to said chamber;
said secondary carrier gas streams deflecting at least a portion of at least one of said second generated evaporated vapor wherein said secondary deflection thereby deflects said second carrier gas streams to the exterior of said substrate thereby coating at least a portion of exterior side of said longitudinal section.

40. The method of claim 39, wherein said primary carrier gas streams is generated from said first nozzle and said at least one evaporant source is disposed in said first nozzle.

41. The method of claim 1, wherein said generated vapor flux having a diameter as said generated vapor flux is deflected into said interior cavity, wherein said vapor flux diameter may be decreased by any one of the following methods:
a) increasing the upstream pressure,
b) increasing the atomic weight of said carrier gas atoms, or
c) increasing the pressure ratio.

42. The method of claim 1, wherein said generated vapor flux having a diameter as said generated vapor flux is deflected into said interior cavity, wherein said method further comprising:
presenting a nozzle, wherein said carrier gas streams are generated from said nozzle and said at least one evaporant source is disposed in said nozzle, and
wherein said vapor flux diameter may be decreased by decreasing the diameter of said nozzle.

43. The method of claim 1, wherein said vapor flux defocuses at the location in said interior cavity where said coating occurs on said at least a portion of interior of said longitudinal section.

44. The method of claim 43, wherein said vapor flux defocuses location defines a gas de-focus region, wherein said gas de-focus region is defined as the location in said interior cavity where said coating occurs on said at least a portion of interior of said longitudinal section.

45. The method of claim 43, wherein said vapor flux defocus location defines a gas jet focal distance, wherein said jet focal distance is defined as the distance between location of said evaporant source and location where vapor flux defocuses.

46. The method of claim 45, wherein said gas jet focal distance can be increased by increasing the gas jet pressure ratio.

47. The method of claim 46, wherein said gas jet pressure ratio is defined by the equation:

$$\frac{P_u}{P_c}$$

$P_u$ is the upstream pressure of at least one nozzle that presents said at least one carrier gas streams to said chamber, and $P_c$ is the downstream pressure of said at least one chamber.

48. The method of claim 45, wherein said gas jet focal distance can be increased by increasing the upstream pressure.

49. The method of claim 45, wherein said gas jet focal distance can be increased by increasing the molecular weight of the carrier gas atoms.

50. The method of claim 45, wherein said gas jet focal distance can be increased by increasing the diameter of the diameter of nozzle opening and evaporant source rod.

51. The method of claim 45, wherein said gas jet focal distance can be increased by increasing the carrier gas stream flow rate or decreasing the pumping rate from said chamber, which both have the effect of increasing both the upstream and downstream pressures if the nozzle diameter is held constant.

52. The method of claim 45, wherein said gas jet focal distance can be decreased by decreasing the gas jet pressure ratio.

53. The method of claim 52, wherein said gas jet pressure ratio is defined by the equation:

$$\frac{P_u}{P_c}$$

$P_u$ is the upstream pressure of at least one nozzle that presents said at least one carrier gas streams to said chamber, and $P_c$ is the downstream pressure of said at least one chamber.

54. The method of claim 45, wherein said gas jet focal distance can be decreased by decreasing the upstream pressure.

55. The method of claim 45, wherein said gas jet focal distance can be decreased by decreasing the molecular weight of the carrier gas atoms.

56. The method of claim 45, wherein said gas jet focal distance can be decreased by decreasing the diameter of the diameter of nozzle opening and evaporant source rod.

57. The method of claim 45, wherein said gas jet focal distance can be decreased by decreasing the carrier gas stream flow rate.

58. The method of claim 45, further comprising:
adjusting said gas focal distance N number (N≧1) of magnitudes,
wherein each said N number of magnitudes of said gas focal distance corresponds with said carrier gas streams deflecting said at least one of said evaporated vapor flux to coat X number (X≧1) of portions of said longitudinal section, each said X number of portions defining a deposition zone.

59. The method of claim 45, further comprising:
adjusting said gas focal distance to a first magnitude,
wherein said first magnitude of said gas focal distance corresponds with said carrier gas streams deflecting said at least one of said evaporated vapor flux to coat a first portion of said longitudinal section, said first portion defining a first deposition zone; and
adjusting said gas focal distance to a second magnitude, and
wherein said second magnitude of said gas focal distance corresponds with said carrier gas streams deflecting said at least one of said evaporated vapor flux to coat a second portion of said longitudinal section, said second portion defining a second deposition zone.

60. The method of claim 59, further comprising:
providing a mask disposed in the interior cavity of said substrate, said mask disposed proximal to said longitudinal section at portions other than said first and second deposition zones;
wherein said mask further defines said first and second deposition zones by preventing said evaporated vapor flux from coating said portions other than said first and second deposition zones.

61. The method of claim 59, further comprising:
adjusting said gas focal distance to a third magnitude,
wherein said third magnitude of said gas focal distance corresponds with said carrier gas streams deflecting said at least one of said evaporated vapor flux to coat a third portion of said longitudinal section, said third portion defining a third deposition zone.

62. The method of claim 61, further comprising:
providing a mask in said interior cavity of said substrate, said mask disposed proximal to said longitudinal section at portions corresponding to said first and second deposition zones;
wherein said mask further defines said third deposition zone by preventing said evaporated vapor flux from coating said first and second deposition zones.

63. The method of claim 45, wherein said presenting at least one evaporant source to said chamber comprises a first and second evaporant source; said impinging comprises impinging said first and second evaporant source to generate a first evaporated vapor flux comprised of evaporant molecules and a second evaporated vapor flux comprised of evaporant molecules; said deflecting comprises deflecting at least a portion of said first and said second generated evaporated vapor fluxes by said primary carrier gas streams into said interior cavity, said method further comprises:
adjusting said focal distance to a first magnitude,
wherein said first magnitude of said gas focal distance corresponds with said carrier gas streams deflecting said first evaporated vapor flux to coat a first portion of said longitudinal section, said first portion defining a first deposition zone; and
adjusting said gas focal distance to a second magnitude,
wherein said second magnitudes of said gas focal distance corresponds with said carrier gas streams deflecting said second evaporated vapor flux to coat a second portion of said longitudinal section, said second portion defining a second deposition zone.

64. The method of claim 63, further comprising:
providing a mask disposed in the interior cavity of said substrate, said mask disposed proximal to said longitudinal section at portions other than said first and second deposition zones;
wherein said mask further defines said first and second deposition zones by preventing said evaporated vapor flux from coating said portions other than said first and second deposition zones.

65. The method of claim 45, wherein said presenting at least one evaporant source to said chamber comprises a first and second evaporant source; said impinging comprises impinging said first and second evaporant source to generate a first evaporated vapor flux comprised of evaporant molecules and a second evaporated vapor flux comprised of evaporant molecules; said deflecting comprises deflecting at least a portion of said first and said second generated evaporated vapor fluxes by said primary carrier gas streams into said interior cavity, said method further comprises:
adjusting said focal distance to a first magnitude,
wherein said first magnitude of said gas focal distance corresponds with said carrier gas streams deflecting said first and second evaporated vapor flux to coat a first portion of said longitudinal section, said first portion defining a first deposition zone.

66. The method of claim 65, further comprising:
providing a mask disposed in the interior cavity of said substrate, said mask disposed proximal to said longitudinal section at a portion other than said deposition zone; and
said mask further defining said deposition zone by preventing said evaporated vapor flux from coating masked portions of said longitudinal section in proximity of said mask.

67. The method of claim 65, wherein said presenting at least one evaporant source to said chamber further comprises a third evaporant source; said impinging further comprises impinging said third evaporant source to generate a third evaporated vapor flux comprised of evaporant molecules and a third evaporated vapor flux comprised of evaporant molecules; said deflecting comprises deflecting at least a portion of said third generated evaporated vapor flux by said primary carrier gas streams into said interior cavity, said method further comprises:
adjusting said gas focal distance to a third magnitude,
wherein said third magnitude of said gas focal distance corresponds with said carrier gas streams deflecting said first evaporated vapor flux to coat a third portion of said longitudinal section, said third portion defining a third deposition zone.

68. The method of claim 67, further comprising:
providing a mask in said interior cavity of said substrate, said mask disposed proximal to said longitudinal section at portions corresponding to said first and second deposition zones;
wherein said mask further defines said third deposition zone by preventing said evaporated vapor flux from coating said first and second deposition zones.

69. The method of claim 45, wherein said impinging further comprises impinging said first or second evaporant sources to generate a third evaporated vapor flux comprised of evaporant molecules and a third evaporated vapor flux comprised of evaporant molecules; said deflecting comprises deflecting at least a portion of said first or second generated evaporated vapor flux by said primary carrier gas streams into said interior cavity, said method further comprises:
adjusting said focal distance to a third magnitude,
wherein said third magnitude of said gas focal distance corresponds with said carrier gas streams deflecting said first or second evaporated vapor flux to coat a third portion of said longitudinal section, said third portion defining a third deposition zone.

70. The method of claim 69, further comprising:
providing a mask disposed in said interior cavity of said substrate, said mask disposed proximal to said longitudinal section at portions corresponding to said first and second deposition zones;
wherein said mask further defining said third deposition zone by preventing said evaporated vapor flux from coating said first and second deposition zones.

71. The method of claim 45, further comprising:
adjusting said gas focal distance to a third magnitude,
wherein said gas focal distance corresponds with said carrier gas streams deflecting said first or second evaporated vapor fluxes to coat a third portion of said longitudinal section, said third portion defining a third deposition zone.

72. The method of claim 71, further comprising:
providing a mask in said interior cavity of said substrate, said mask disposed proximal to said longitudinal section at portions corresponding to said first and second deposition zones;
wherein said mask further defining said third deposition zone by preventing said evaporated vapor flux from coating said first and second deposition zones.

73. The method of claim 1, further comprising:
a primary nozzle, wherein said primary carrier gas streams is generated from said primary nozzle; and
a secondary nozzle, wherein said secondary carrier gas streams is generated from said primary nozzle and said secondary nozzle is disposed in the interior cavity of said substrate.

74. The method of claim 73, wherein said substrate comprises a housing.

75. The method of claim 74, wherein said housing comprises a shape comprising at least one of: tube, casing, cylinder, drum, basket, receptacle, bin, box, collar, hamper, well, cell, cell-case, case, shell, hoop, cover, envelope, enclosure, chamber, sleeve, holder, repository, shelter, body, or bowl.

76. The method of claim 74, wherein said longitudinal section comprises one or more walls, and at least one of said one or more walls further comprising an appendage extending there from,
said secondary gas secondarily deflecting said at least at least a portion of said generated evaporated vapor flux that has been deflected into said interior cavity of said substrate by said carrier gas streams thereby coating at least a portion of said appendage, wherein said at least a portion of said appendage defining an appendage deposition zone.

77. The method of claim 76, wherein said appendage providing an appendage interior cavity, said appendage interior cavity in communication with said substrate interior cavity.

78. A method for applying at least one coating on a stationary chamber, said method comprising:
said chamber having a downstream pressure, Pc, with an operating range from about $10^{-4}$ to about $10^3$ Torr;
presenting at least one evaporant source to said chamber;
presenting primary carrier gas streams comprised of gas molecules to said chamber, impinging at least one said evaporant source with at least one electron energetic beam in said chamber to generate an evaporated vapor flux comprised of evaporant molecules; and said primary carrier gas streams deflecting at least a portion of at least one of said generated evaporated vapor flux, wherein said evaporated flux at least partially coats a portion of said chamber.

79. The method of claim 78, wherein said chamber is a tube.

80. The method of claim 79, wherein said tube comprises a shape comprising at least one of: tube, casing, cylinder, drum, basket, receptacle, bin, box, collar, hamper, well, cell, cellcase, case, shell, hoop, cover, envelope, housing, enclosure, chamber, sleeve, holder, repository, shelter, body, or bowl.

81. The method of claim 80, wherein said tube further comprises at least one branch.

82. The method of claim 81, wherein said evaporated flux at least partially coats a portion of said at least one branch.

83. The method of claim 81, further comprising:
presenting a secondary carrier gas streams comprised of gas molecules to said chamber, and
said secondary carrier gas streams deflecting at least a portion of at least one of said generated evaporated vapor flux, wherein said secondarily deflected evaporated flux at least partially coats a portion of said at least one branch.

84. The method of claim 81, further comprising:
presenting a secondary carrier gas streams comprised of gas molecules to said chamber, and
said secondary carrier gas streams deflecting at least a portion of at least one of said generated evaporated vapor flux that has been deflected by said primary carrier gas streams, wherein said secondarily deflected evaporated flux at least partially coats a portion of said at least one branch.

85. The method of claim 78, further comprising:
presenting a secondary carrier gas streams comprised of gas molecules to said chamber, and
said secondary carrier gas streams deflecting at least a portion of at least one of said generated evaporated vapor flux, wherein said secondarily deflected evaporated flux at least partially coats a portion of said chamber.

86. The method of claim 78, further comprising:
presenting a secondary carrier gas streams comprised of gas molecules to said chamber, and
said secondary carrier gas streams deflecting at least a portion of at least one of said generated evaporated vapor flux that has been deflected by said primary carrier gas streams, wherein said secondarily deflected evaporated flux at least partially coats a portion of said chamber.

87. The method of claim 78, further comprising:
providing a magnetic field or electromagnetic field that manipulates said electronic energetic beam in said chamber.

88. The method of claim 87, wherein said magnetic field provided by a magnetic device or electromagnetic device.

89. The method of claim 88, wherein said magnetic device or electromagnetic device disposed inside or outside said camber or located both inside and outside said chamber.

90. An apparatus for applying at least one coating on at least one substrate, said apparatus comprising:
a chamber; said chamber having a downstream pressure, Pc, with an operating range from about $10^{-4}$ to about $10^3$ Torr, wherein said at least one substrate is placed in said chamber in a stationary manner, said substrate having a distal end and a proximal end defining a longitudinal section therebetween, said substrate having an interior cavity;
at least one evaporant source disposed in said chamber;
primary carrier gas streams comprised of gas molecules provided in said chamber,
at least one energetic beam, said at least one energetic beam impinging on said evaporant source and generating an evaporated vapor flux comprised of evaporant molecules; and
wherein said primary carrier gas streams deflect at least a portion of said generated evaporated vapor flux by said primary carrier gas streams from an area distal from and external to said stationary substrate into said interior cavity of said stationary substrate thereby coating at least a portion of interior of said longitudinal section.

91. The apparatus of claim 90, further comprising:
a first nozzle, wherein said primary carrier gas streams is generated from said first nozzle and said at least one evaporant source is disposed in said first nozzle.

92. The apparatus of claim 90, further comprising:
a first nozzle, wherein said primary carrier gas streams are generated from said first nozzle and said at least one evaporant source is disposed in proximity to said first nozzle.

93. The apparatus of claim 90, wherein said energetic beam comprises at least one of electron beam source, laser source, heat source, ion bombardment source, highly focused incoherent light source, microwave, radio frequency, EMF, or any energetic beam that break chemical bonds, or any combination thereof.

94. The apparatus of claim 90, wherein said coating apparatus comprises:
directed vapor deposition (DVD) apparatus, evaporation (thermal, RF, laser, or electron beam) apparatus, reactive evaporation apparatus, sputtering (DC, RF, microwave and/or magnetron) apparatus, reactive sputtering apparatus, electron beam physical vapor deposition (EF-PVD) apparatus, ion plasma deposition (IPD) apparatus, low pressure plasma spray (LPPS) apparatus, high velocity oxy-fuel (HVOF) apparatus, vapor deposition apparatus, or cluster deposition apparatus.

95. The apparatus of claim 90, wherein said coating apparatus comprises a directed vapor deposition (DVD) apparatus.

96. The apparatus of claim 90, wherein said evaporated flux at least partially coats said portion of said interior of said longitudinal section on a non-line-of-sight region relative to said evaporant sources.

97. The apparatus of claim 90, wherein said evaporated flux at least partially coats said portion of said interior of said longitudinal section on a limited-line-of-sight region relative to said evaporant sources.

98. The apparatus of claim 90, wherein said evaporated flux at least partially coats said portion of said interior of said longitudinal section on a limited-line-of-sight region and a non-line-of-sight region relative to said evaporant sources.

99. The apparatus of claim 90, further comprises:
a deflector member; and
said deflector member secondarily deflecting said at least a portion of said generated evaporated vapor flux that has been deflected into said interior cavity by said carrier gas streams thereby coating at least a portion of said longitudinal section, wherein said at least a portion of said longitudinal section defining a deposition zone.

100. The apparatus of claim 90, further comprising:
a secondary carrier gas stream comprised of gas molecules in said interior cavity of said substrate, and said secondary carrier gas stream secondarily deflecting said portion of said generated evaporated vapor flux that has been deflected into said interior cavity by said carrier gas streams thereby coating at least a portion of said longitudinal section, wherein said portion of said longitudinal section defines a deposition zone.

101. The apparatus of claim 90, further comprising:

a baffle member; and said baffle member secondarily deflecting said at least a portion of said generated evaporated vapor flux that has been deflected into said interior cavity by said carrier gas streams thereby coating at least a portion of said longitudinal section, wherein said at least a portion of said longitudinal section defining a deposition zone.

102. The apparatus of claim 90, further comprising:

a baffle member; and said baffle member stagnating flow of said at least a portion of said generated evaporated vapor flux that has been deflected into said interior cavity by said carrier gas streams thereby coating at least a portion of said longitudinal section in proximity to said baffle.

103. The apparatus of claim 90, further comprising:

a first nozzle;

a second nozzle, wherein a second primary carrier gas stream is generated from said second nozzle and a second said evaporant source is disposed in said second nozzle;

impinging said second evaporant source with at least one electron energetic beam in said chamber to generate a second evaporated vapor flux comprised of evaporant molecules;

presenting a secondary carrier gas stream comprised of gas molecules to said chamber;

said secondary carrier gas stream deflecting at least a portion of at least one of said second generated evaporated vapor wherein said secondary deflection thereby deflects said secondary carrier gas stream to the exterior of said substrate thereby coating at least a portion of exterior side of said longitudinal section.

104. The apparatus of claim 90, further comprising:

a primary nozzle, wherein said primary carrier gas stream is generated from said primary nozzle; and a secondary nozzle, wherein said secondary carrier gas stream is generated from said primary nozzle and said secondary nozzle is disposed in the interior cavity of said substrate.

105. An apparatus for applying at least one coating on a stationary chamber comprising:

said chamber having a downstream pressure, Pc, with an operating range from about $10^{-4}$ to about $10^3$ Torr;

at least one evaporant source presented to said chamber;

primary carrier gas streams comprised of gas molecules to said chamber, at least one said evaporant source, said at least one evaporant source be impinged by at least one electron energetic beam in said chamber to generate an evaporated vapor flux comprised of evaporant molecules; and said primary carrier gas streams deflecting at least a portion of at least one of said generated evaporated vapor flux, wherein said evaporated flux at least partially coats a portion of said chamber.

106. The apparatus of claim 105, further comprising:

a magnetic field or electromagnetic field that manipulates said electronic energetic beam in said chamber.

107. The method of claim 1, wherein said longitudinal section comprises at least one of the following: planar surface, indented surface, convex surface, concave surface, ridged surface, corrugated surface, grooved surface, curved surface, multi-contoured surface, core comprised of truss units or truss-like units, core of textile layers or textile like layers, multi-channel surface, porous structure, or micro-porous structure, or any combination thereof.

108. The method of claim 1, wherein said interior cavity comprises at least one of the following: recess, aperture, port, duct, trough, bore, inlet, outlet, uptake, intake, hole, conduit, perforation, channel, groove, socket, seat, passage, pipe, indentation, pocket, sink, cell, slot, hollow-out-portion, sieve, orifice, flute, chamber, well, tunnel, or channel, or any combination thereof.

109. The method of claim 11, wherein said tube comprises at least one of the following: hose, conduit, cable, stem, collet, flange, thimble, ring, ferrule, bushing, collar, nipple, or sleeve, or any combination thereof.

* * * * *